(12) United States Patent
Lutze et al.

(10) Patent No.: US 8,199,586 B2
(45) Date of Patent: Jun. 12, 2012

(54) PROGRAMMING AND SELECTIVELY ERASING NON-VOLATILE STORAGE

(75) Inventors: Jeffrey W. Lutze, San Jose, CA (US); Yan Li, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/168,855

(22) Filed: Jun. 24, 2011

(65) Prior Publication Data

US 2011/0261621 A1 Oct. 27, 2011

Related U.S. Application Data

(63) Continuation of application No. 12/167,135, filed on Jul. 2, 2008, now Pat. No. 8,014,209.

(51) Int. Cl.
*G11C 16/04* (2006.01)
(52) U.S. Cl. ............ 365/185.29; 365/185.24; 365/185.3
(58) Field of Classification Search ............ 365/185.29, 365/185.23, 185.24, 185.17, 185.18, 185.3
See application file for complete search history.

(56) References Cited

U.S. PATENT DOCUMENTS

| | | | |
|---|---|---|---|
| 5,696,717 A | 12/1997 | Koh | |
| 6,011,287 A | 1/2000 | Itoh et al. | |
| 6,212,103 B1 | 4/2001 | Ahrens et al. | |
| 6,370,061 B1 | 4/2002 | Yachareni et al. | |
| 6,373,746 B1 | 4/2002 | Takeuchi et al. | |
| 6,442,071 B2 | 8/2002 | Choi | |
| 6,788,580 B2 | 9/2004 | Takahashi | |
| 6,894,926 B2 | 5/2005 | Guterman et al. | |
| 6,903,981 B2 | 6/2005 | Futatsuyama et al. | |
| 6,907,497 B2 | 6/2005 | Hosono et al. | |
| 7,203,874 B2 | 4/2007 | Roohparvar | |
| 7,397,706 B2 | 7/2008 | Byeon et al. | |
| 7,430,138 B2 | 9/2008 | Higashitani | |
| 7,457,168 B2 | 11/2008 | Jeong et al. | |
| 7,492,636 B2 | 2/2009 | Wu | |
| 7,548,458 B2 | 6/2009 | Wu | |
| 7,561,469 B2 | 7/2009 | Aritome | |
| 7,630,251 B2 | 12/2009 | Hosono | |
| 7,852,683 B2 | 12/2010 | Lutze et al. | |
| 7,965,554 B2 | 6/2011 | Lutze et al. | |
| 7,978,530 B2 | 7/2011 | Lutze et al. | |
| 2002/0057600 A1 | 5/2002 | Sakui | |
| 2003/0161191 A1 | 8/2003 | Matsuda et al. | |
| 2005/0012139 A1 | 1/2005 | Sekimoto et al. | |
| 2005/0083738 A1 | 4/2005 | Huang | |
| 2007/0047327 A1 | 3/2007 | Goda et al. | |
| 2007/0171719 A1 | 7/2007 | Hemink et al. | |
| 2007/0183223 A1 | 8/2007 | Aritome | |
| 2008/0137409 A1 | 6/2008 | Nakamura et al. | |
| 2008/0266980 A1 | 10/2008 | Wu | |
| 2009/0290429 A1 | 11/2009 | Dong et al. | |
| 2010/0002513 A1 | 1/2010 | Lutze et al. | |

(Continued)

OTHER PUBLICATIONS

Notice of Allowance and Fee(s) Due dated Oct. 11, 2011, U.S. Appl. No. 13/152,252, filed Jun. 2, 2011, 16 pages.

(Continued)

*Primary Examiner* — Richard Elms
*Assistant Examiner* — Hien Nguyen
(74) *Attorney, Agent, or Firm* — Vierra Magen Marcus & DeNiro LLP

(57) ABSTRACT

A non-volatile storage system performs programming for a plurality of non-volatile storage elements and selectively performs re-erasing of at least a subset of the non-volatile storage elements that were supposed to remain erased, without intentionally erasing programmed data.

20 Claims, 20 Drawing Sheets

U.S. PATENT DOCUMENTS

2010/0002514 A1    1/2010    Lutze et al.
2010/0002515 A1    1/2010    Lutze et al.
2011/0007569 A1    1/2011    Lutze et al.

OTHER PUBLICATIONS

International Search Report dated Sep. 4, 2009, PCT Application No. PCT/US2009/049238, filed Jun. 30, 2009.

Written Opinion of the International Searching Authority dated Sep. 4, 2009, PCT Application No. PCT/US2009/049238, filed Jun. 30, 2009.

International Search Report dated Sep. 4, 2009, PCT Application No. PCT/US2009/049230, filed Jun. 30, 2009.

Written Opinion of the International Searching Authority dated Sep. 4, 2009, PCT Application No. PCT/US2009/049230, filed Jun. 30, 2009.

International Search Report dated Sep. 10, 2009, PCT Application No. PCT/US2009/049240, filed Jun. 30, 2009.

Written Opinion of the International Searching Authority dated Sep. 10, 2009, PCT Application No. PCT/US2009/049240, filed Jun. 30, 2009.

Sugiura et al., "An Over-Program Detection and Correction Scheme for NAND Flash Memory," Non-Volatile Semiconductor Memory Workshop, Aug. 1, 1998, pp. 120-123.

Response to European Office Action dated Mar. 28, 2011, European Patent Office, European Patent Application No. 09774332.2 filed Jun. 30, 2009 18 pages.

Response to European Office Action dated Mar. 28, 2011, European Patent Office, European Patent Application No. 09774324.9 filed Jun. 30, 2009 17 pages.

Response to European Office Action dated Mar. 25, 2011, European Patent Office, European Patent Application No. 09774330.6 filed Jun. 30, 2009 18 pages.

Japanese Preliminary Amendment dated Apr. 4, 2011, Japanese Patent Office, PCT JP National Stage Application Corresponding to International Application No. PCT/US2009/049238 filed Jun. 30, 2009 5 pages.

Partial English translation of Japanese Preliminary Amendment dated Apr. 4, 2011, Japanese Patent Office, PCT JP National Stage Application Corresponding to International Application No. PCT/US2009/049238 filed Jun. 30, 2009 5 pages.

Office Action dated Mar. 25, 2010, U.S. Appl. No. 12/167,124, filed Jul. 2, 2008, 23 pages.

Response A to Office Action dated Apr. 7, 2010, U.S. Appl. No. 12/167,124, filed Jul. 2, 2008, 11 pages.

Office Action dated Jul. 13, 2010, U.S. Appl. No. 12/167,124, filed Jul. 2, 2008, 23 pages.

Response B to Office Action dated Dec. 13, 2010, U.S. Appl. No. 12/167,124, filed Jul. 2, 2008, 15 pages.

Notice of Allowance and Fee(s) Due dated Mar. 14, 2011, U.S. Appl. No. 12/167,124, filed Jul. 2, 2008, 21 pages.

Notice of Allowance and Fee(s) Due dated Jan. 11, 2010, U.S. Appl. No. 12/167,128, filed Jul. 2, 2008, 12 pages.

Notice of Allowance and Fee(s) Due dated May 17, 2010, U.S. Appl. No. 12/167,128, filed Jul. 2, 2008, 10 pages.

Notice of Allowance and Issue Fee(s) Due dated Aug. 19, 2010, U.S. Appl. No. 12/167,128, filed Jul. 2, 2008, 8 pages.

Notice of Allowance and Issue Fee(s) Due dated Oct. 6, 2010, U.S. Appl. No. 12/167,128, filed Jul. 2, 2008, 8 pages.

Notice of Allowance and Fee(s) Due dated Mar. 4, 2011, U.S. Appl. No. 12/877,383, filed Sep. 8, 2010, 25 pages.

Office Action dated Mar. 31, 2010, U.S. Appl. No. 12/167,135, filed Jul. 2, 2008, 15 pages.

Response A to Office Action dated Jun. 29, 2010, U.S. Appl. No. 12/167,135, filed Jul. 2, 2008, 11 pages.

Office Action dated Sep. 15, 2010, U.S. Appl. No. 12/167,135, filed Jul. 2, 2008, 16 pages.

Response B to Office Action dated Dec. 15, 2010, U.S. Appl. No. 12/167,135, filed Jul. 2, 2008, 10 pages.

Notice of Allowance and Fee(s) Due dated Mar. 17, 2011, U.S. Appl. No. 12/167,135, filed Jul. 2, 2008, 18 pages.

U.S. Appl. No. 13/152,252, filed Jun. 2, 2011.

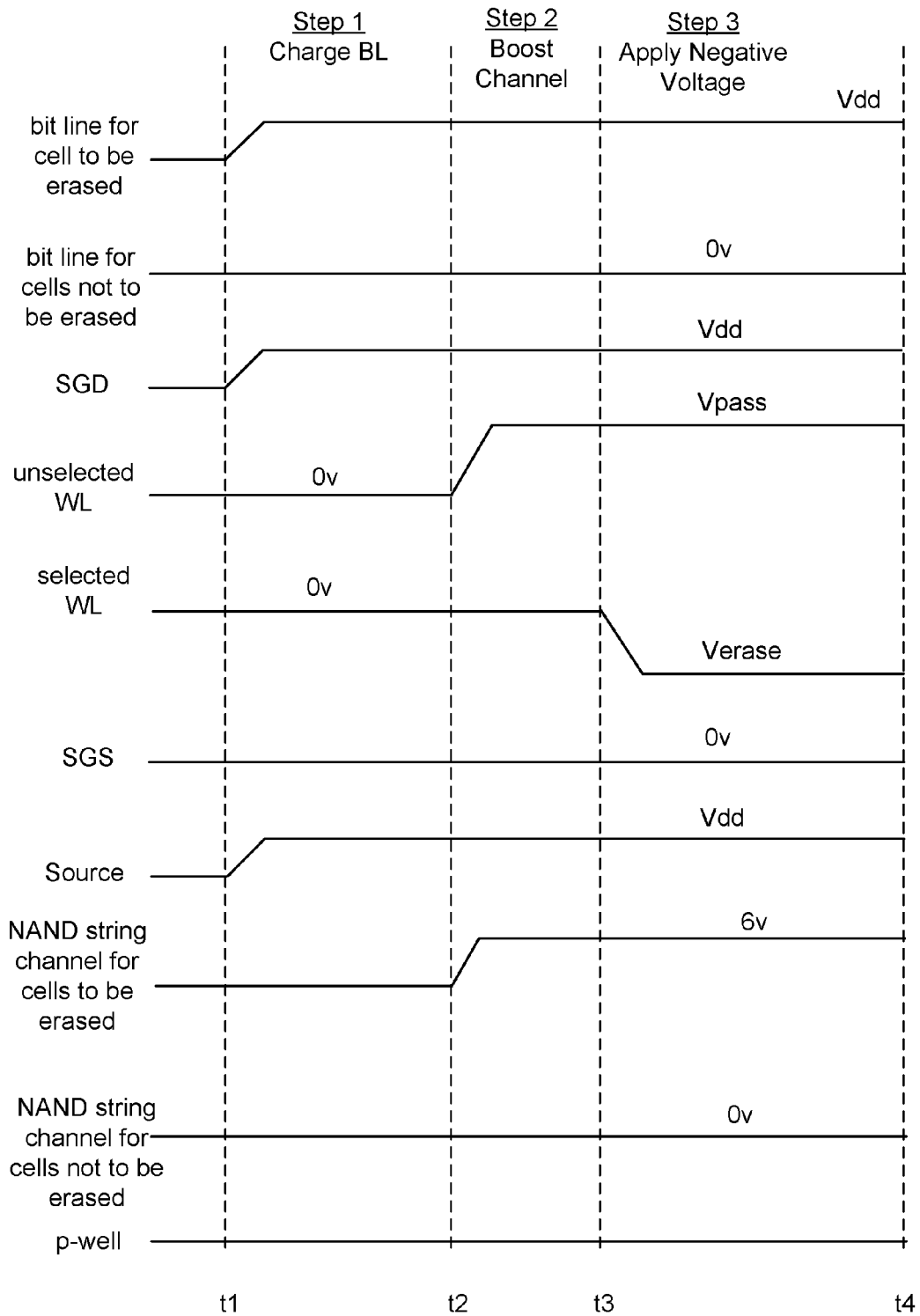

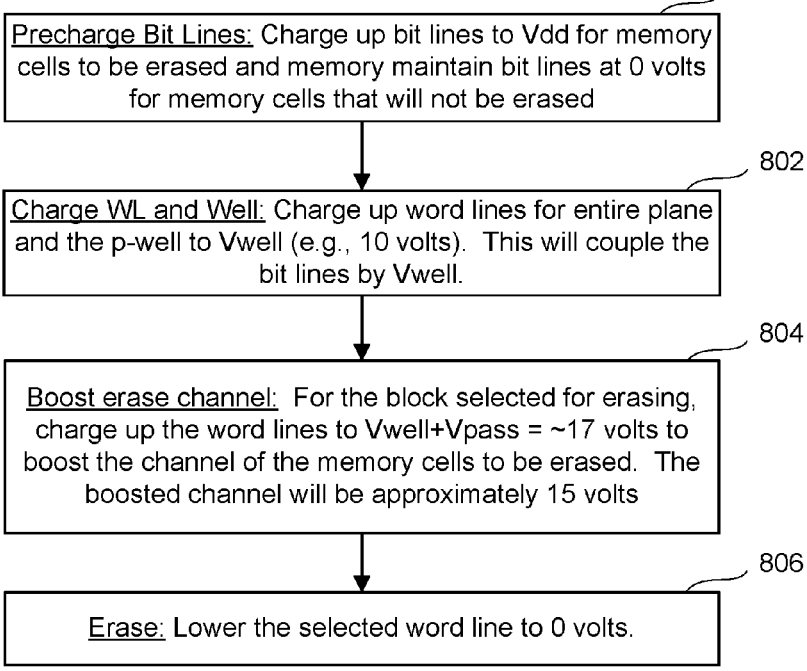
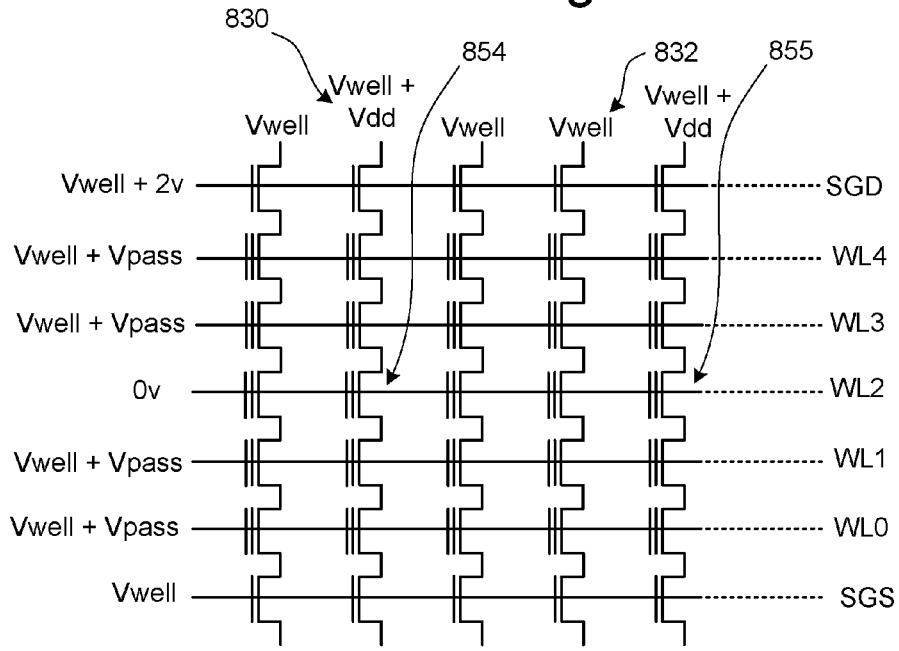

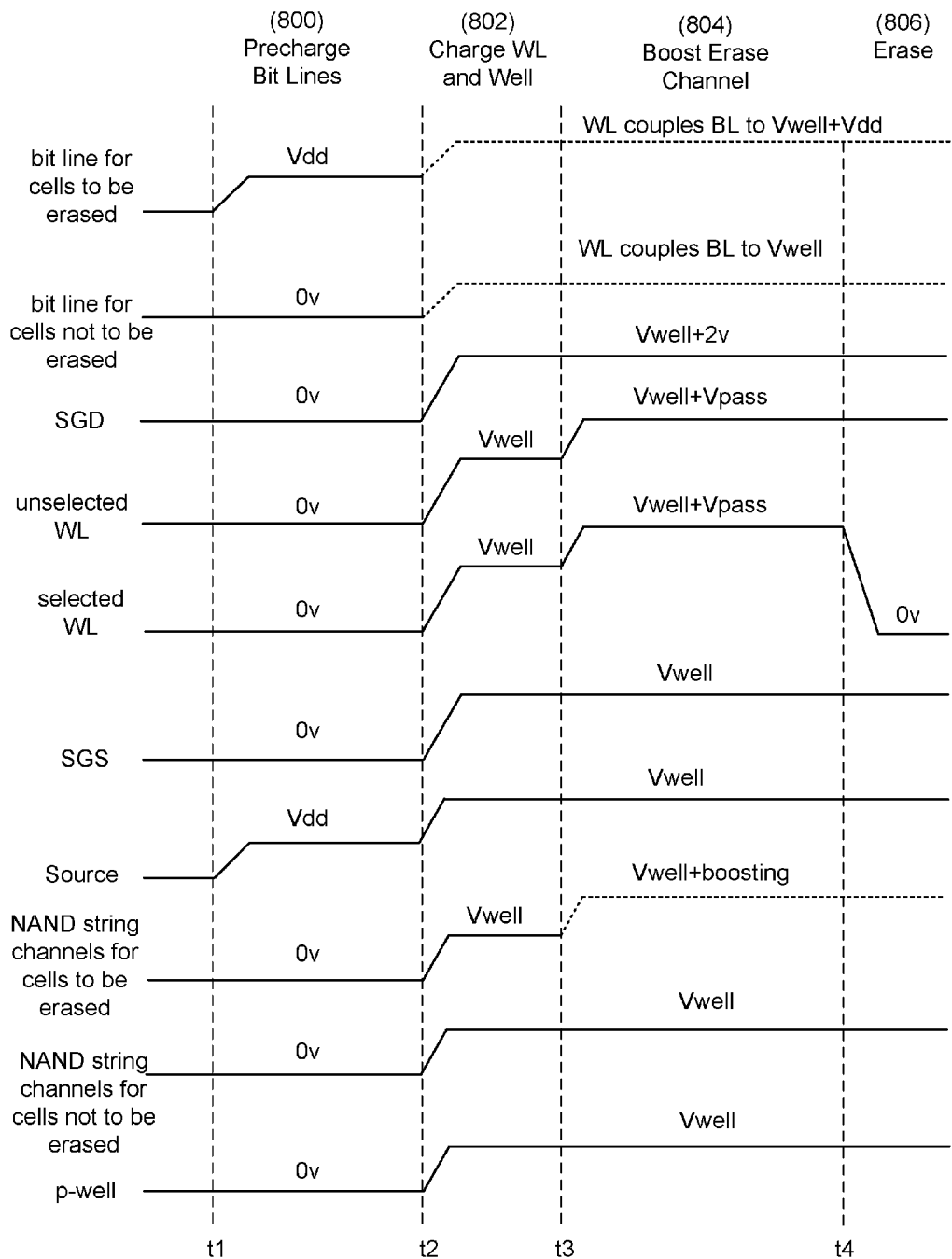

| Word Line | Program 1st Pass | Selective Erase | Program 2nd Pass |
|---|---|---|---|
| 4 | 10 | 13 | 15 |
| 3 | 7 | 11 | 14 |
| 2 | 4 | 8 | 12 |
| 1 | 2 | 5 | 9 |
| 0 | 1 | 3 | 6 |

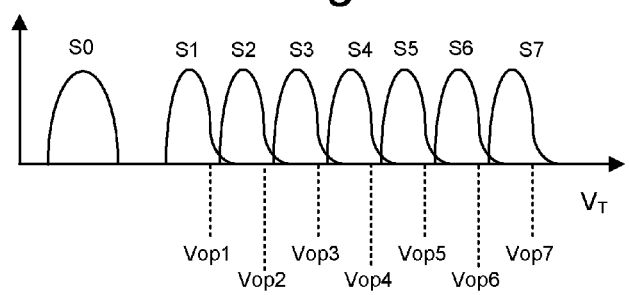
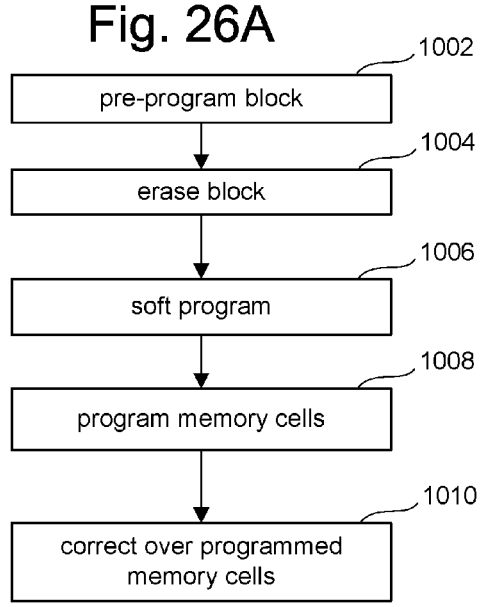
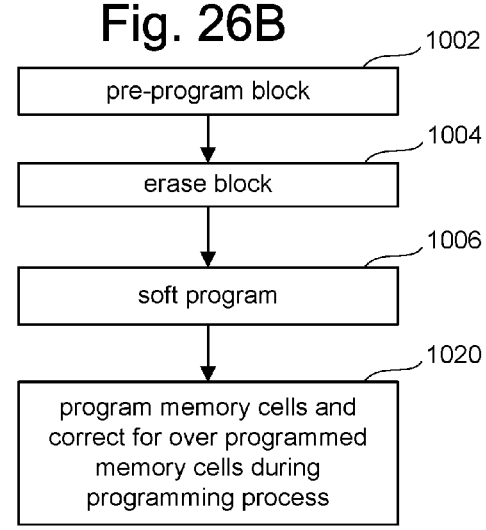

PROGRAMMING AND SELECTIVELY ERASING NON-VOLATILE STORAGE

CLAIM OF PRIORITY

This application is a continuation application of U.S. patent application Ser. No. 12/167,135, now U.S. Pat. No. 8,014,209, "Programming And Selectively Erasing Non-Volatile Storage", filed on Jul. 2, 2008, by Lutze, et al., and which is incorporated herein by reference.

BACKGROUND

1. Field

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate (or other charge storage region). That is, the minimum amount of voltage that must be applied to the control gate before the transistor is turned on to permit conduction between its source and drain is controlled by the level of charge on the floating gate (or other charge storage region).

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self-Boosting Technique For Non-Volatile Memory," and U.S. Pat. No. 6,917,545, titled "Detecting Over Programmed Memory," both of which are incorporated herein by reference in their entirety.

Some EEPROM and flash memory devices have a floating gate (or other charge storage region) that is used to store two ranges of charges and, therefore, the memory cell can be programmed/erased between two states (an erased state and a programmed state). Such a flash memory device is sometimes referred to as a binary memory device.

A multi-state memory device is implemented by identifying multiple distinct allowed/valid programmed threshold voltage ranges separated by forbidden ranges. Each distinct threshold voltage range corresponds to a data state associated with a predetermined value for the set of data bits encoded in the memory device.

Shifts in the apparent charge stored on a floating gate can occur because of the coupling of an electric field based on the charge stored in adjacent floating gates (or other charge types of charge storage regions). This floating gate to floating gate coupling phenomena is described in U.S. Pat. No. 5,867,429, which is incorporated herein by reference in its entirety.

The effect of the floating gate to floating gate coupling is of greater concern for multi-state devices because in multi-state devices the allowed threshold voltage ranges and the forbidden ranges are narrower than in binary devices. Therefore, the floating gate to floating gate coupling can result in memory cells being shifted from an allowed threshold voltage range to a forbidden range or to the wrong allowed threshold voltage range.

The floating gate to floating gate coupling can occur between sets of adjacent memory cells that have been programmed at different times. For example, a first memory cell is programmed to add a level of charge to its floating gate that corresponds to one set of data. Subsequently, one or more adjacent memory cells are programmed to add a level of charge to their floating gates that correspond to a second set of data. After the one or more of the adjacent memory cells are programmed, the charge level read from the first memory cell appears to be different than programmed because of the effect of the charge on the adjacent memory cells being coupled to the first memory cell. The coupling from adjacent memory cells can shift the apparent charge level being read a sufficient amount to lead to an erroneous reading of the data stored.

The floating gate to floating gate coupling can also occur between sets of adjacent memory cells that have been programmed concurrently. For example, two adjacent multi-state memory cells may be programmed to different target levels such that a first memory cell is programmed to a state corresponding to a lower threshold voltage and a second memory cell is programmed to a state corresponding to a higher threshold voltage. The memory cell being programmed to the state corresponding to the lower threshold voltage is likely to reach that state and be locked out from further programming before the second memory cell reaches the state corresponding to the higher threshold voltage. After the second memory cell reaches the state corresponding to the higher threshold voltage, it will couple to the first memory cell and cause the first memory cell to have a higher apparent threshold voltage than programmed.

As memory cells continue to shrink in size, the natural programming and erase distributions of threshold voltages are expected to increase due to short channel effects, greater oxide thickness/coupling ratio variations and more channel dopant fluctuations, thereby reducing the available separation between adjacent data states/allowed threshold voltage ranges. This effect is much more significant for multi-state memories than memories using only two states (binary memories). Furthermore, the reduction of the space between word lines and reduction of the space between bit lines will also increase the coupling between adjacent floating gates. As coupling increases and threshold voltage distributions increase, it will become more difficult to implement multi-state memories.

SUMMARY

In a population of memory cells that are being programmed with data, those memory cells that are to remain erased can potentially experience more coupling than memory cells being programmed. Therefore, a system is provided that can selectively erase or otherwise adjust some memory cells without erasing or otherwise adjusting all memory cells. This way, memory cells that were supposed to remain erased but appear to have been changed due to coupling can be re-erased or otherwise adjusted.

One embodiment includes erasing non-volatile storage elements, and performing programming for the non-volatile storage elements as well as selectively performing re-erasing of at least a subset of non-volatile storage elements that were supposed to remain erased without intentionally erasing programmed data.

One embodiment includes erasing a set of non-volatile storage elements and receiving data to be stored by the set of non-volatile storage elements. The received data indicates that some of the non-volatile storage elements are to be programmed and some of the non-volatile storage elements are to remain erased. The process further includes programming the data into the set of non-volatile storage elements and selectively performing re-erasing of at least a subset of non-volatile storage elements that were supposed to remain erased without intentionally erasing non-volatile storage element storing properly programmed data.

One embodiment includes erasing a set of non-volatile storage elements connected to a first control line and a set of non-volatile storage elements connected to a second control line, performing a first pass of a first multi-pass programming process for non-volatile storage elements connected to the first control line, performing a first pass of a second multi-pass programming process for the non-volatile storage elements connected to the second control line, (after performing the first pass of the second multi-pass programming process) selectively performing re-erasing of at least a subset of the non-volatile storage elements connected to the first control line that were supposed to remain erased, selectively performing re-erasing of at least a subset of the non-volatile storage elements connected to the second control line that were supposed to remain erased, (after selectively performing re-erasing of at least a subset of the non-volatile storage elements connected to the first control line) performing a second pass of the first multi-pass programming process for the non-volatile storage elements connected to the first control line, and performing a second pass of the second multi-pass programming process for the non-volatile storage elements connected to the second control line.

One example implementation includes a plurality of non-volatile storage elements and one or more managing circuits in communication the plurality of non-volatile storage elements. The one or more managing circuits erase the non-volatile storage elements and perform programming for the non-volatile storage elements as well as selectively perform re-erasing of at least a subset of non-volatile storage elements that were supposed to remain erased without intentionally erasing programmed data.

One example implementation includes a plurality of non-volatile storage elements, means for erasing the non-volatile storage elements, and means for performing programming for the non-volatile storage elements as well as selectively performing re-erasing of at least a subset of non-volatile storage elements that were supposed to remain erased without intentionally erasing programmed data.

BRIEF DESCRIPTION OF THE DRAWINGS

FIG. 10 is a timing diagram for a selective erase operation.
FIG. 13 is a flow chart describing one embodiment of a process for performing a selective erase operation.
FIG. 14 is a timing diagram for a selective erase operation.
FIG. 15 depicts NAND strings during a selective erase operation.
FIG. 25 depicts threshold voltage distributions.
FIG. 26A is a flow chart describing one embodiment of a process for programming that includes correcting for over programming by using a selectively erase process.
FIG. 26B is a flow chart describing one embodiment of a process for programming that includes correcting for over programming by using a selectively erase process.

DETAILED DESCRIPTION

Figure 1:
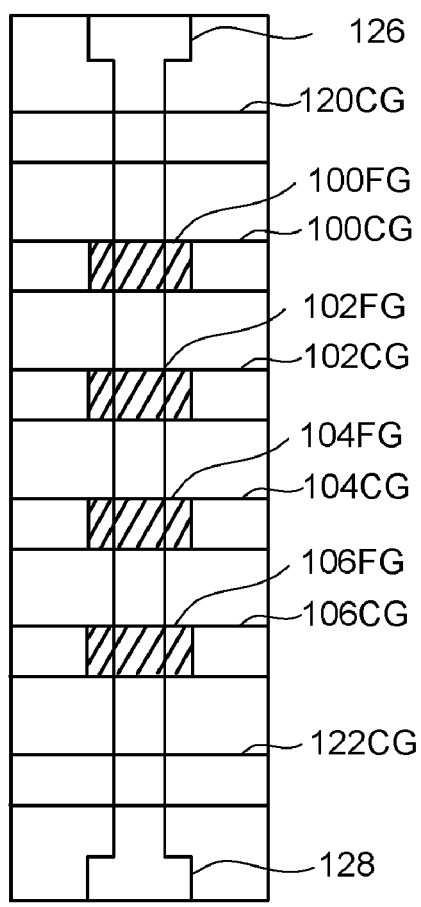
FIG. 1 is a top view of a NAND string.
Figure 2:
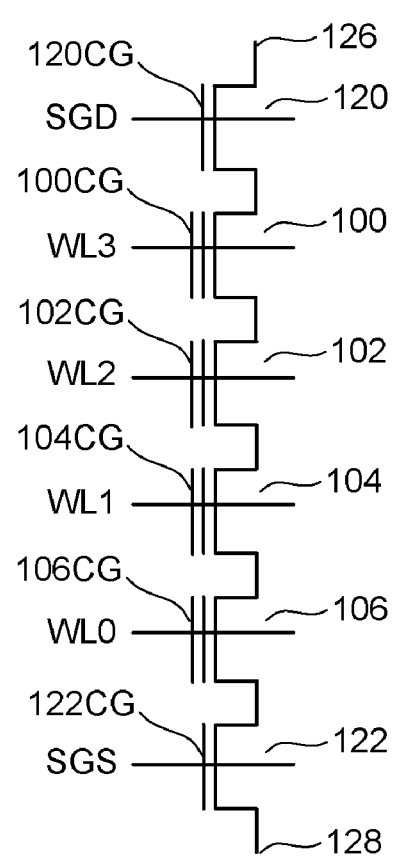
FIG. 2 is an equivalent circuit diagram of the NAND string.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Relevant examples of NAND type flash memories and their operation are provided in the following U.S. patents/patent applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices, in addition to NAND flash memory, can also be used. For example, non-volatile memory devices are also manufactured from memory cells that use a dielectric layer for storing charge. Instead of the conductive floating gate elements described earlier, a dielectric layer is used. Such memory devices utilizing a dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric. Other types of non-volatile storage can also be used.

Figure 3:
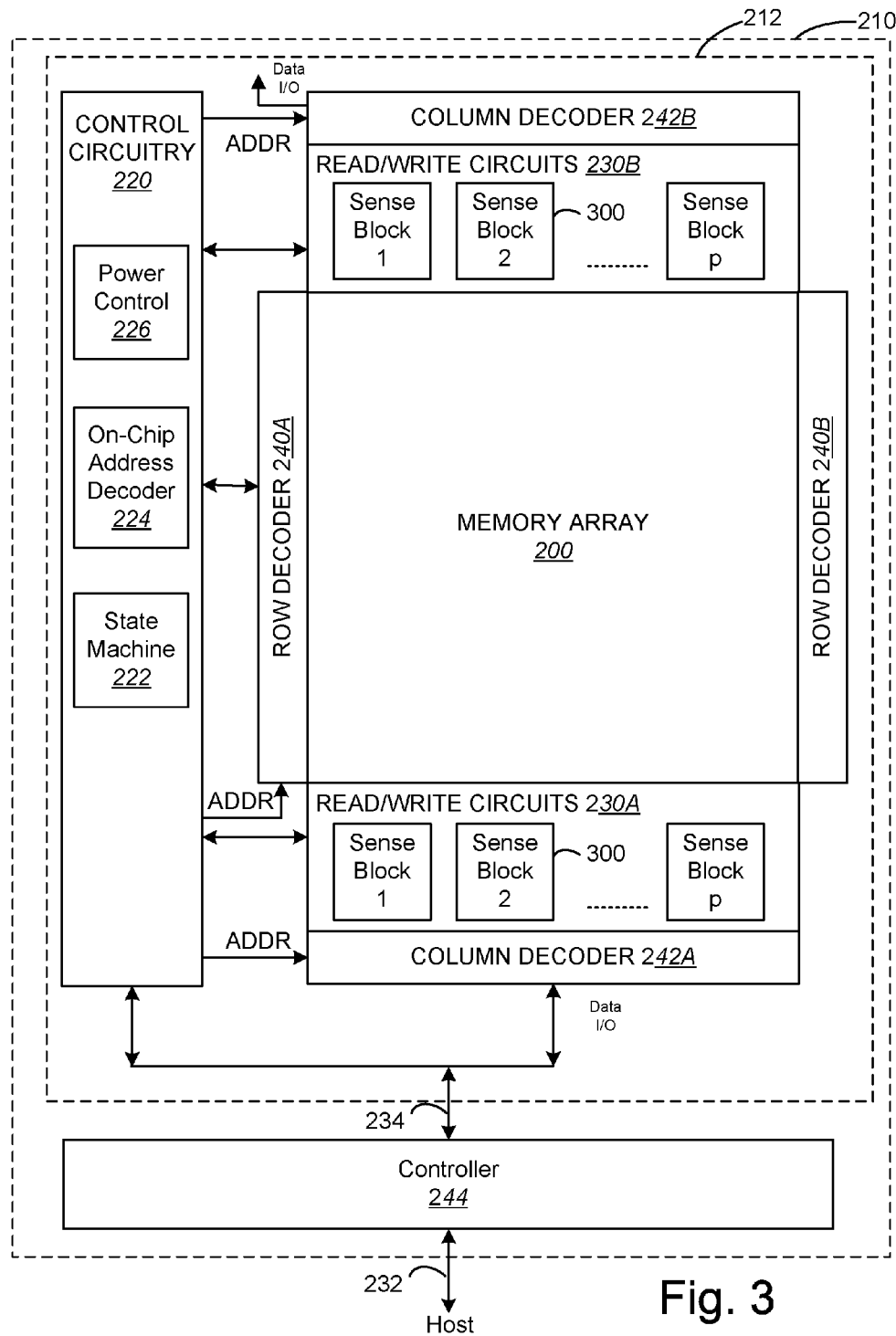
FIG. 3 is a block diagram of a non-volatile memory system.

FIG. 3 illustrates a memory device 210 having read/write circuits for reading and programming a page (or other unit) of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. Word lines and bit lines are examples of control lines. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing or control circuits. The one or more managing or control circuits perform the processes described herein.

Figure 4:
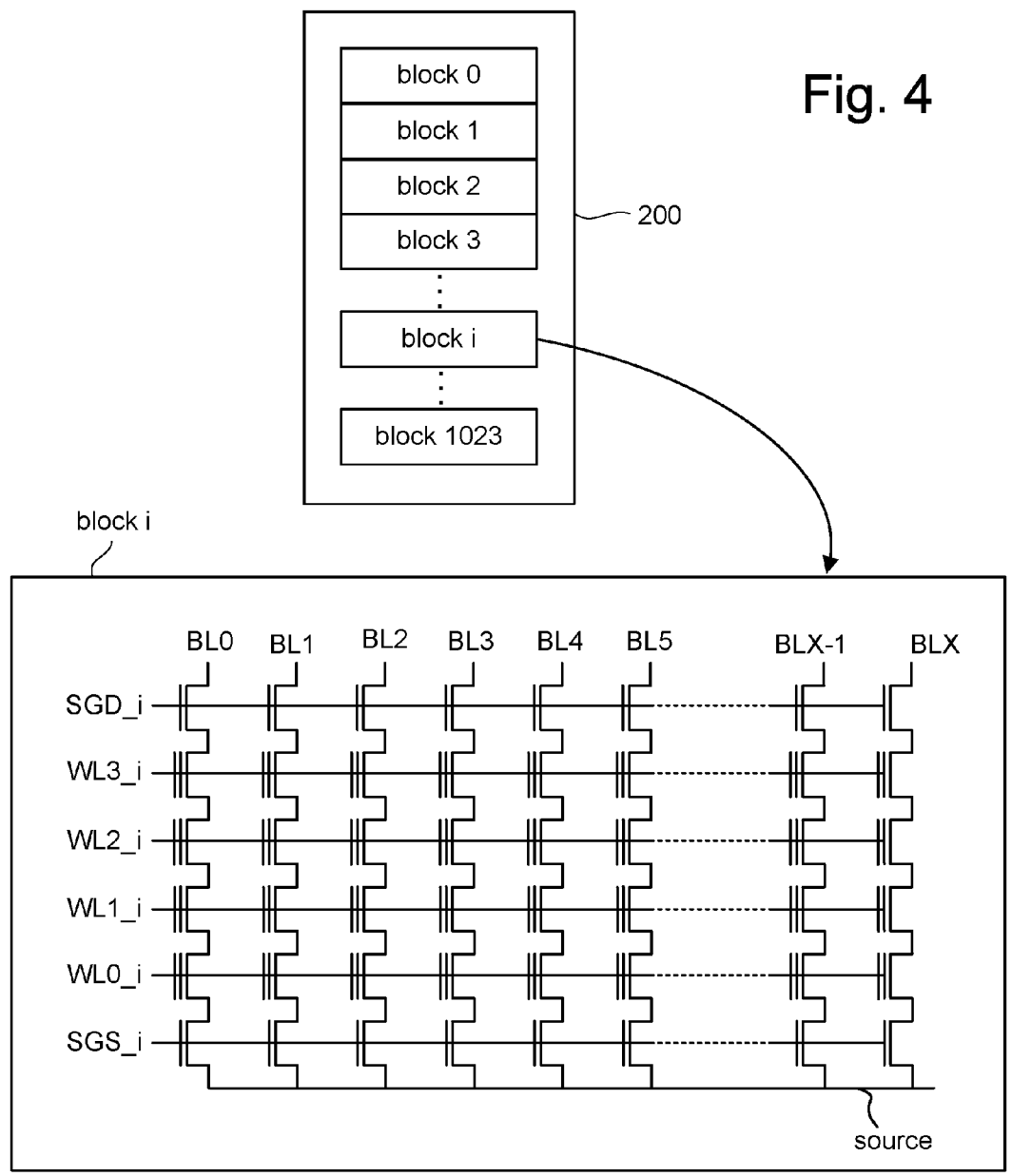
FIG. 4 is a block diagram depicting one embodiment of a memory array.

FIG. 4 depicts an exemplary structure of memory cell array 200. In one embodiment, the array of memory cells is divided into a large number of blocks (e.g., blocks 0-1023, or another amount) of memory cells. In one embodiment, the block is the unit of conventional erase. Other units of erase can also be used.

A block contains a set of NAND stings which are accessed via bit lines (e.g., bit lines BL0-BLX) and a common set of word lines (WL0, WL1, WL2, WL3). FIG. 4 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS). In one embodiment, each NAND string includes two dummy memory cells, one at each end of the NAND string. The dummy memory cells are not used to store data.

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. A page can store one or more sectors. A sector includes user data and overhead data (also called system data). Overhead data typically includes header information and Error Correction Codes (ECC) that have been calculated from the user data of the sector. The controller (or state machine, or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

In some embodiments, the memory cells include a triple well comprising a p substrate, a n-well within the p substrate, and a p-well within the n-well. The channel regions, source regions and drain regions are typically positioned in the p-well. The p-well and n-well are considered part of the substrate. In one embodiment, the entire array of memory cells is within one p-well, with trenches in the p-well providing electrical isolation between NAND strings. In one implementation all of the blocks in the same p-well that share the same set of bit lines are referred to as a plane. In other embodiments, different blocks can be in different p-wells.

In addition, the device can have the reverse polarity such that the triple well comprises a n substrate, a p-well within the n substrate, and a n-well within the p-well. In this configuration, the channel regions, the source regions and the drain regions are typically positioned in the n-well.

Figure 5:
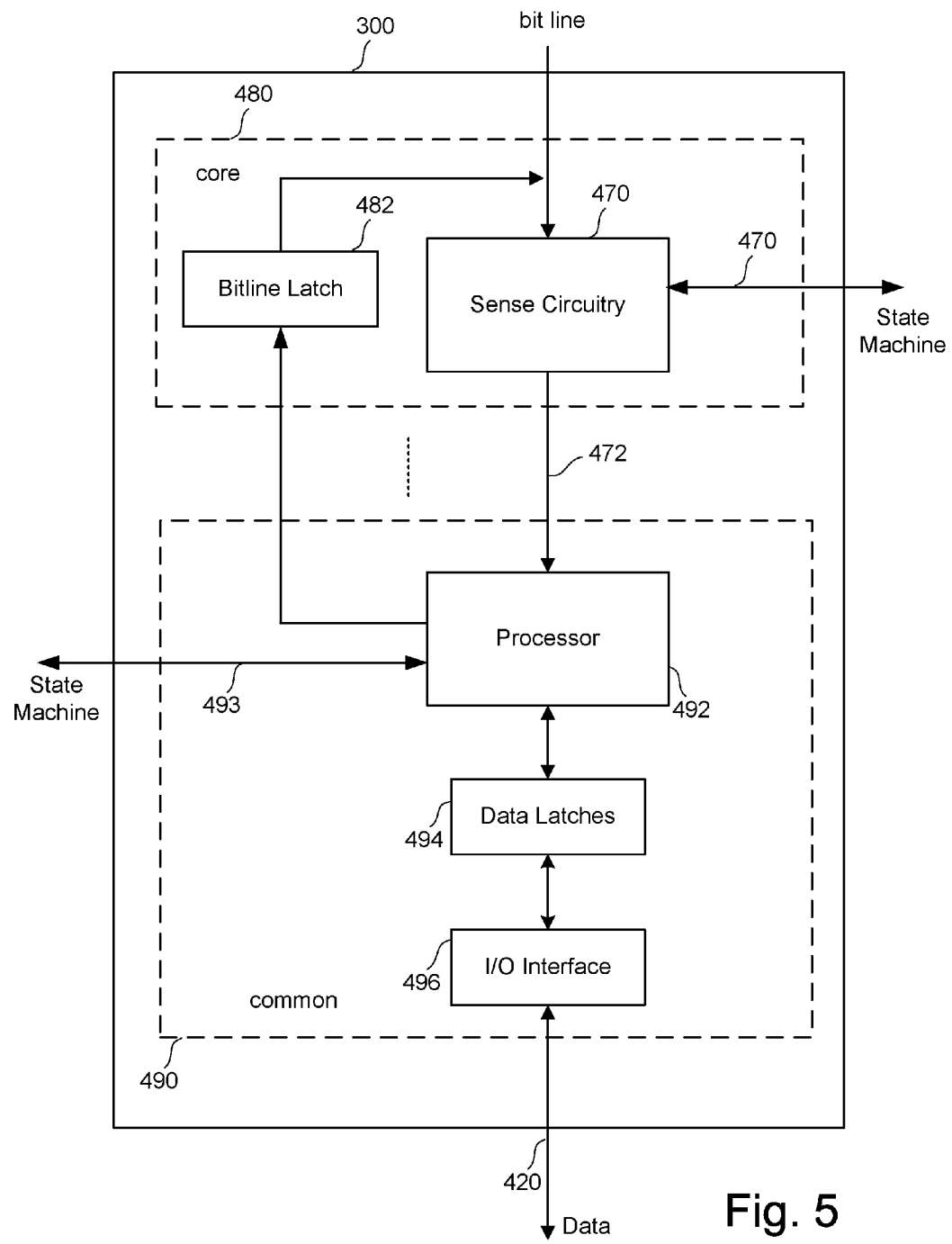
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. One example can be found in U.S. Patent Application Publication 2006/0140007, which is incorporated herein by reference in its entirety.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls (using power control 226) the supply of different control gate voltages to the addressed memory cell(s). As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

Data latch stack 494 contains a stack of data latches corresponding to the sense module. In one embodiment, there are three (or four or another number) data latches per sense module 480. In one embodiment, the latches are each one bit.

During program or verify, the data to be programmed is stored in the set of data latches 494 from the data bus 420. During the verify process, Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) United States Patent Application Publication No. 2004/0057287, "Non-Volatile Memory And Method With Reduced Source Line Bias Errors," published on Mar. 25, 2004; (2) United States Patent Application Publication No. 2004/0109357, "Non-Volatile Memory And Method with Improved Sensing," published on Jun. 10, 2004; (3) U.S. Patent Application Publication No. 20050169082; (4) U.S. Patent Application Publication No. 2006/0221692, titled "Compensating for Coupling During Read Operations of Non-Volatile Memory," Inventor Jian Chen, filed on Apr. 5, 2005; and (5) U.S. Patent Application Publication No. 2006/0158947, titled "Reference Sense Amplifier For Non-Volatile Memory", Inventors Siu Lung Chan and Raul-Adrian Cernea, filed on Dec. 28, 2005. All five of the immediately above-listed patent documents are incorporated herein by reference in their entirety.

Figure 6A:
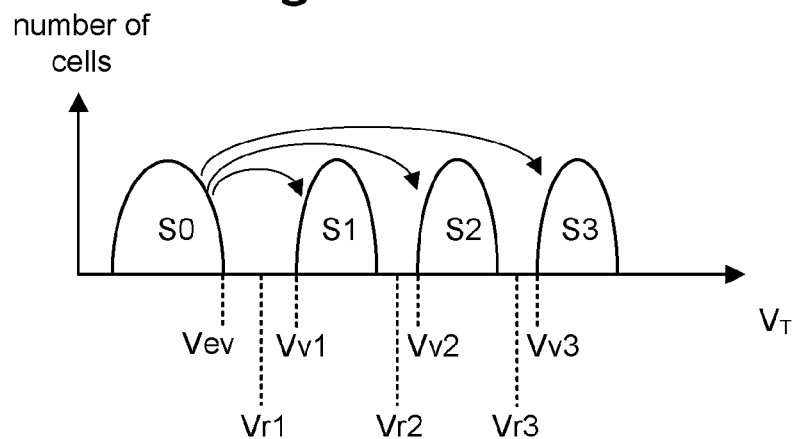
FIGS. 6A-C depict threshold voltage distributions.

At the end of a successful programming process, the threshold voltages of the memory cells should be within one or more distributions of threshold voltages for programmed memory cells or within a distribution of threshold voltages for erased memory cells, as appropriate. FIG. 6A illustrates example threshold voltage distributions (each corresponding to a data state) for the memory cell array when each memory cell stores two bits of data. Other embodiments, however, may use more or less than two bits of data per memory cell. For example, three bits of data per memory cell, four bits of data per memory cell, or other amounts can also be used. FIG. 6A shows a first threshold voltage distribution/data state S0 for erased memory cells. Three threshold voltage distributions/data states, S1, S2 and S3 for programmed memory cells, are also depicted. In one embodiment, the threshold voltages in S0 are negative and threshold voltages in S1, S2 and S3 are positive. In some embodiments, multiple threshold voltage distributions correspond to negative threshold voltages.

Each distinct threshold voltage distribution of FIG. 6A corresponds to a data state that has predetermined values for the set of data bits. The specific relationship between the data programmed into the memory cell and the threshold voltage levels of the memory cells depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges/data states using a Gray code assignment so that if the threshold voltage of a floating gate erroneously shifts to its neighboring physical state, only one bit will be affected. One example assigns "11" to threshold voltage distribution/data state S0, "10" to threshold voltage distribution/data state S1, "00" to threshold voltage distribution/data state S2 and "01" to threshold voltage distribution/data state S3. In this example, if a memory cell is erased and the data to be programmed is 11, then the memory cell need not change its threshold voltage since it is already in S0, which is associated with 11. If a memory cell is erased and the data to be programmed is 00, then the threshold voltage of the memory cell needs to be moved to S2.

FIG. 6A also shows three read reference voltages, Vr1, Vr2 and Vr3, for reading data from memory cells. By testing whether the threshold voltage of a given memory cell is above or below Vr1, Vr2 and Vr3, the system can determine what threshold voltage distribution/data state the memory cell is in.

FIG. 6A also shows three verify reference voltages, Vv1, Vv2 and Vv3. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3.

In one embodiment, known as full sequence programming, memory cells can be programmed from the erased threshold voltage distribution/data state S0 directly to any of the programmed threshold voltage distributions/data states S1, S2 or S3. For example, a population of memory cells to be programmed may first be erased so that all memory cells in the population are in erased threshold voltage distribution/data state S0. While some memory cells are being programmed from threshold voltage distribution/data state S0 to threshold voltage distribution/data state S1, other memory cells are being programmed from threshold voltage distribution/data state S0 to threshold voltage distribution/data state S2 and/or from threshold voltage distribution/data state S0 to threshold voltage distribution/data state S3. Full sequence programming is graphically depicted by the three curved arrows of FIG. 6A.

Figure 6B:
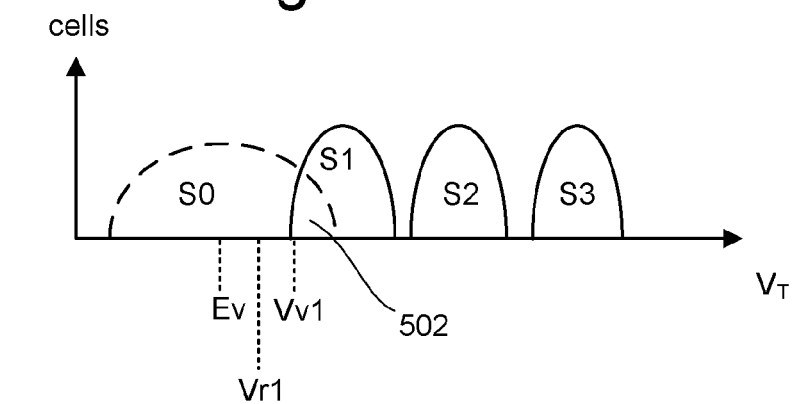

Memory cells can suffer from capacitive coupling from neighbor memory cells on the same word line, on the same bit line, or an adjacent word line and an adjacent bit line. The capacitive coupling serves to raise the apparent threshold voltage of a memory cell because the neighbor memory cell has been programmed; however, the floating gate may not have added or lost an amount of charge. The increase in apparent threshold voltages for many memory cells causes the threshold voltage distributions to widen, as depicted in FIG. 6B. In some cases of severe capacitive coupling, the threshold voltage for the erased state can be widened to the point where it overlaps with the first programmed state. For example, FIG. 6B shows threshold voltage distribution/data state S0 overlapping with threshold voltage distribution/data state S1 because threshold voltage distribution/data state S0 has been widened due to capacitive coupling from neighboring memory cells. In some cases, a page or sector comprised of memory cells whose threshold voltages are overlapping cannot be correctly read back because the system will be unable to determine whether the cells are in state 0 or state 1.

Figure 6C:
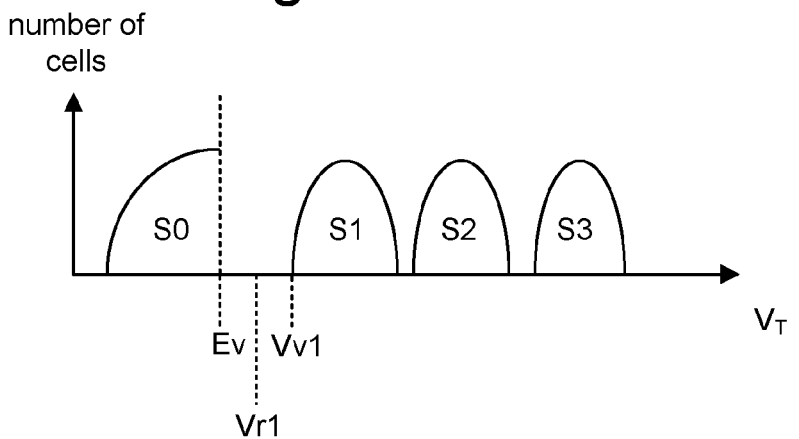

The technology proposed herein selectively performs erase operations to re-erase those memory cells that should be in erased state 0 but, due to capacitive coupling (or other reasons), have threshold voltages that appear to be outside the threshold voltage distribution of erased data state S0. The selective erasing is performed without intentionally erasing programmed data in any of the memory cells that are supposed to be programmed. Thus, in one embodiment, threshold voltage distribution/data state S0 of FIG. 6B will be tightened to become like threshold voltage distribution/data state S0 of FIG. 6C, where all of the memory cells in threshold voltage distribution/data state S0 have a threshold voltage below the erase verify level Ev. In one embodiment, Ev=0 volts. The memory cells in states S1, S2 and S3 will not experience erase operations during the selective erasing.

Figure 7:
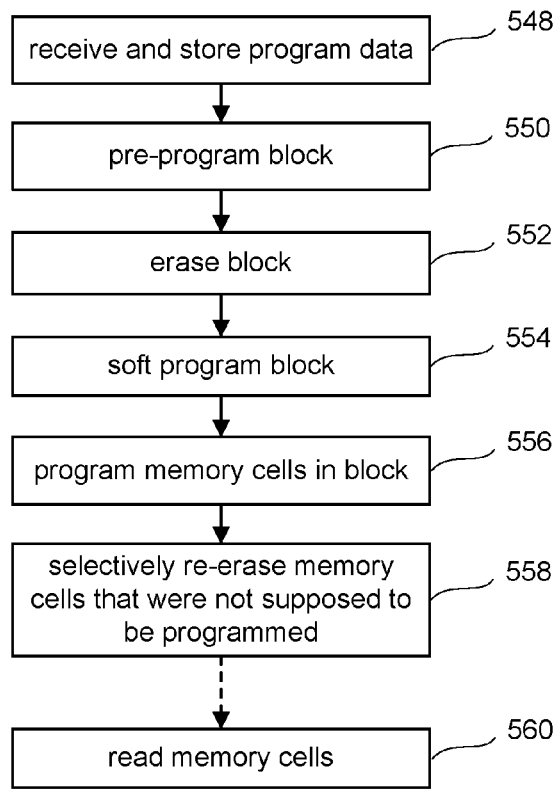
FIG. 7 is a flow chart describing one embodiment of a process for operating non-volatile memory.

FIG. 7 is a flow chart describing a process for operating non-volatile storage. In step 548, a request to program and the data to program are received. The data is stored. The data can be stored in the controller, the state machine, a buffer, or elsewhere. In one implementation of the process of FIG. 7, memory cells are pre-programmed in order to maintain even wear on the memory cells (step 550). In one embodiment, the memory cells are preprogrammed to state S3 (the highest state), a random pattern, or any other pattern. In some implementations, pre-programming need not be performed.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that a selected to be erased, a strong electric field is consequently applied to the tunnel oxide layers of selected memory cells and the selected memory cells are erased as electrons of the floating gates are emitted to the substrate side, typically by a Fowler-Nordheim tunneling mechanism. As electrons are transferred from the floating gate to the p-well region, the threshold voltage of a selected cell is lowered. Erasing can be performed on the entire memory array, on individual blocks, or another unit of cells. In one embodiment, after erasing the memory cells, all of the erased memory cells will be in data state S0 (see FIG. 6A). One implementation of an erase process includes applying several erase pulses to the p-well and verifying between erase pulses whether the memory cells have threshold voltages below Vev.

At step 554, soft programming is (optionally) performed to narrow the distribution of erased threshold voltages for the erased memory cells. Some memory cells may be in a deeper erased state than necessary as a result of the erase process. Soft programming can apply programming pulses to the control gates in order to move the threshold voltage of the deeper erased memory cells closer to the erase verify level Ev. For example, looking at FIG. 6A, step 554 can include tightening the threshold voltage distribution associated with state S0. In step 556, the memory cells of the block are programmed. The process of FIG. 7 can be performed at the direction of the state machine using the various circuits described above. In other embodiments, the process of FIG. 7 can be performed at the direction of the controller using the various circuits described above. In step 558, the memory system (at the direction of the controller and/or the state machine) selectively performs erase operations for (e.g. to re-erase) those memory cells that should be erased state but have threshold voltages that appear to be outside the threshold voltage distribution of the erased data state. The selective erasing is performed without intentionally erasing programmed data in any of the memory cells that are supposed to be programmed. After the memory cells have been programmer and (possibly) selectively re-erased, the memory cells can be read (step 560) and the data read can be reported to the controller and/or host that is in communication with the controller.

Figure 8:
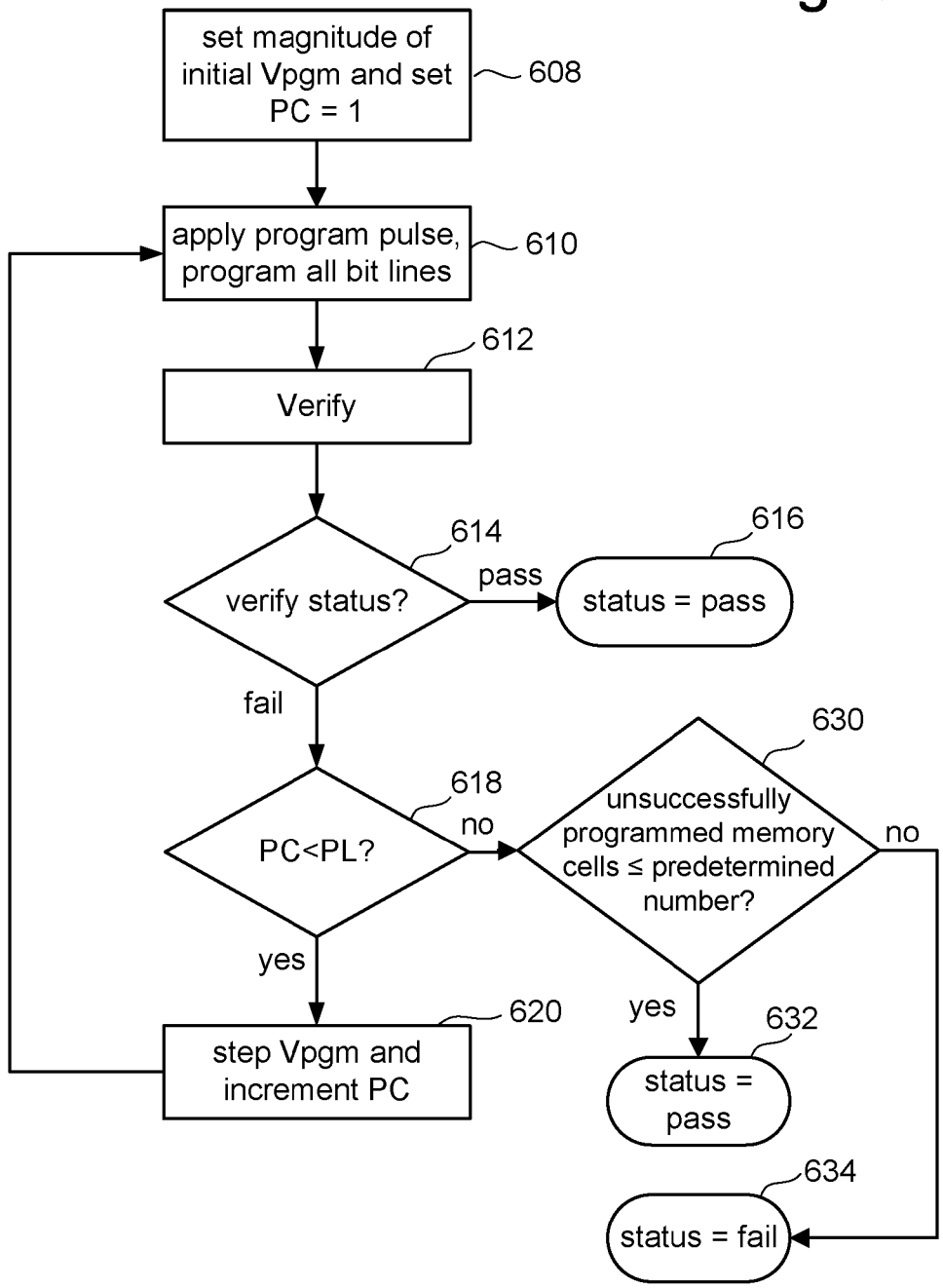
FIG. 8 is a flow chart describing one embodiment of a process for programming non-volatile memory.

FIG. 8 is a flow chart describing one embodiment of a process for performing programming on memory cells connected to a common word line. The process of FIG. 8 can be performed one or multiple times during step 556 of FIG. 7. For example, the process of FIG. 8 can be used to perform the full sequence programming of FIG. 6A, in which case the process of FIG. 8 would be performed once for each word line. In one embodiment, the programming process is performed in an order that starts from the word line closest to the source line and works toward the bit line. The process of FIG. 8 can also be used to perform the programming of one page (or partial page or other unit) of data for a word line, or one pass of a multi-pass programming processes. Other arrangements can also be used. The process of FIG. 8 is performed at the direction of the state machine 222. The technology described herein for erasing can be used with many different programming schemes.

Typically, the programming voltage (Vpgm) applied to the control gate during a program operation is applied as a series of program pulses. In between programming pulses are a set of verify pulses to enable verification. In many implementations, the magnitude of the program pulses is increased with each successive pulse by a predetermined step size. In step 608 of FIG. 8, the programming voltage Vpgm is initialized to the starting magnitude (e.g., ~12-16V or another suitable level) and a program counter PC is initialized at 1. In step 610, a program pulse of the programming voltage Vpgm is applied to the selected word line (the word line selected for programming). The unselected word lines receive one or more boosting voltages (e.g., ~9 volts) to perform boosting schemes known in the art. If a memory cell should be programmed, then the corresponding bit line is grounded. On the other hand, if the memory cell should remain at its current threshold voltage, then the corresponding bit line is connected to $V_{DD}$ (approximately 2.5 volts) to inhibit programming (lock out the memory cell from programming). More information about boosting schemes can be found in U.S. Pat. No. 6,859,397 and U.S. Patent Application Publication No. 20080123425, both of which are incorporated herein by reference in their entirety.

In step 610, the program pulse is concurrently applied to all memory cells connected to the selected word line so that all of the memory cells connected to the selected word line that are selected for programming are programmed together. In this manner all of the memory cells connected to the selected word line will concurrently have their threshold voltage change, unless they have been locked out from programming.

In step 612, the states of the selected memory cells are verified using the appropriate set of target levels. Step 612 of FIG. 8 includes performing one or more verify operations. In general, during verify operations and read operations, the selected word line is connected to a voltage, a level of which is specified for each read and verify operation (e.g. see Vv1, Vv2 and Vv3 of FIG. 6A for verify and Vr1, Vr2 and Vr3 for reading) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge the corresponding bit line, where the bit line was pre-charged to a known voltage. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287, "Non-Volatile Memory And Method With Reduced Source Line Bias Errors;" (2) United States Patent Application Pub No. 2004/0109357, "Non-Volatile Memory And Method with Improved Sensing;" (3) United States Patent Application Pub. No. 20050169082; and (4) United States Patent Publication 2006/0221692, titled "Compensating for Coupling During Read Operations of Non-Volatile Memory."

If it is detected that the threshold voltage of a selected memory cell has reached the appropriate target level, then the memory cell is locked out of further programming by, for example, raising its bit line voltage to Vdd during subsequent programming pulses.

Looking back at FIG. 8, in step 614 it is checked whether all of memory cells have reached their target threshold voltages. If so, the programming process is complete and successful because all selected memory cells were programmed and verified to their target states. A status of "PASS" is reported in step 616. Note that in some implementations, in step 614 it is checked whether at least a predetermined number of memory cells have been properly programmed. This predetermined number can be less than the number of all memory cells, thereby allowing the programming process to stop before all memory cells have reached their appropriate verify levels. The memory cells that are not successfully programmed can be corrected using error correction during the read process.

If, in step 614, it is determined that not all of the memory cells have reached their target threshold voltages, then the programming process continues. In step 618, the program counter PC is checked against a program limit value (PL). One example of a program limit value PL is 20; however, other values can be used. If the program counter PC is not less than the program limit value, then it is determined in step 630 whether the number of memory cells that have not been successfully programmed is equal to or less than a predetermined number. If the number of unsuccessfully programmed memory cells is equal to or less than the predetermined number, then the programming process is considered successful and a status of PASS is reported in step 632. In many cases, the memory cells that are not successfully programmed can be corrected using error correction during the read process. If however, the number of unsuccessfully programmed memory cells is greater than the predetermined number, the program process is considered unsuccessful and a status of FAIL is reported in step 634.

If, in step 618, it is determined that the Program Counter PC is less than the Program Limit value PL, then the process continues at step 620 during which time the program counter PC is incremented by 1 and the program voltage Vpgm is stepped up to the next magnitude. For example, the next pulse will have a magnitude greater than the previous pulse by a step size (e.g., a step size of 0.1-0.4 volts). After step 620, the process loops back to step 610 and another program pulse is applied to the selected word line, and the process continues.

Figure 9:
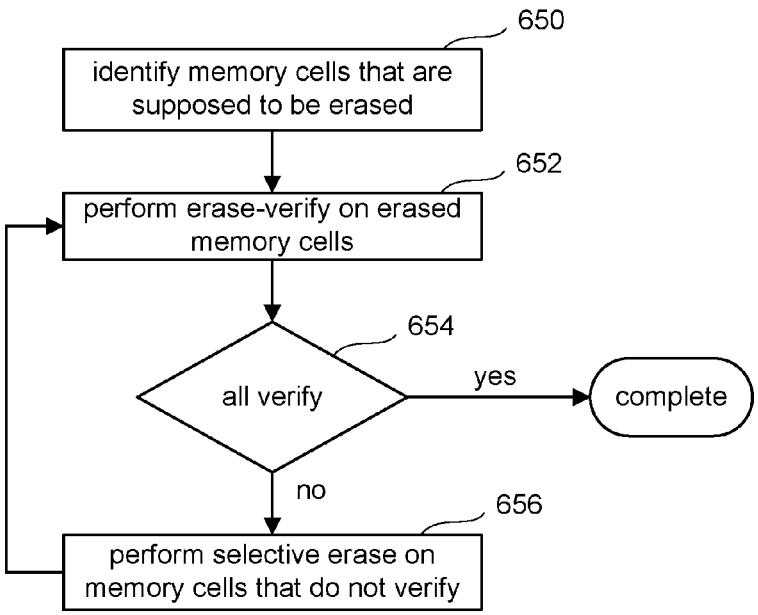
FIG. 9 is a flow chart describing one embodiment of a process for performing a selective erase process.

FIG. 9 is a flow chart describing a process for selectively performing erase operations for those memory cells that should be erased state but have threshold voltages that appear to be outside the threshold voltage distribution of the erased data state. In one embodiment, the process of FIG. 9 is performed for one selected word line such that the selective erasing is performed on those memory cells connected to the one selected word line. In other variations, memory cells connected to different word lines can be simultaneously subjected to the selective erase process.

In step 650, the memory cells that are supposed to remain erased are identified. For example, if state S0 corresponds to data 11, state S1 corresponds to data 10, state S2 corresponds to data 00 and state S3 corresponds to data 01, then all memory cells that are supposed to be storing data 11 should remain erased (e.g., remain in state S0). There are many suitable ways to identify the memory cells that are supposed to remain erased. In one example, data currently being programmed or recently programmed can be stored in a buffer (in RAM or flash memory). This data can be read from the buffer in step 650 and the system will identify memory cells that are supposed to be storing data 11 using the controller (see FIG. 3), state machine (see FIG. 3) or processor 492 (see FIG. 4). In another embodiment, the data could be reissued from the controller to the state machine or processor 492 in order to determine which memory cells are supposed to be storing data 11. In another embodiment, data currently being programmed or recently programmed can be stored in data latches 494 and used by processor 492 to determine which memory cells are supposed to be storing data 11.

In step 652, an erase verify operation is performed on the memory cells connected to the selected word line. The erase verify operation determines whether the memory cells have been properly erased. In one example, the erase verify operation determines whether the threshold voltages of the memory cells are greater then the erase verify compare voltage Vev (see FIG. 6A). The selected word line receives the erase verify compare voltage Vev and the unselected word lines receive an overdrive voltage (approximately 8 to 10 volts), sometimes referred to as Vread. As explained above with respect to step 612 of FIG. 8, after applying the appropriate word line voltages (which provides the voltages to the control gates), the conduction currents of the selected memory cells are observed/measured to determiner whether the memory cells are conducting. Memory cells that conduct in response to the erase verify voltage Vev are assumed to have a threshold voltage within state S0 and therefore are properly erased. Memory cells that do not conduct in response to receiving the erase verify voltage Vev and that are supposed to be in the erase state S0 are concluded to have threshold voltages that appear to be outside (e.g., above) the threshold voltage distribution for erase data state S0. In step 654, if all the memory cells verify (that is, all memory cells conduct in response to Vev), then the process of FIG. 9 is completed. In one embodiment, if at least a predetermined number of memory cells pass the erase verification process in step 652, then the process of FIG. 9 is complete. If less than all memory cells verify appropriately (or less than a predetermined number of memory cells verify), then the process continues at step 656 and a selective erase operation is performed on those memory cells that are supposed to be in a erase state S0 but that did not pass the verification process of step 652. Any memory cell that passed the verification process at step 652 will be locked out of the selective erase process of step 656, as discussed below. After performing the selective erase process of step 656, the process loops back to step 652 and another erase verify process is performed. The loop of step 652, 654 and 656 is performed until all memory cells verify or a predetermined number of memory cells properly verify. In other embodiments, the loop can be limited by a maximum number of iterations.

FIG. 10 is a timing chart that describes the selective erase operation of step 656 of FIG. 9. FIG. 10 shows voltage signals for bit lines connected to memory cells that will be selectively erased, bit lines that are connected to memory cells that will not be erased, SGD, unselected word lines, the selected word line, SGS, the source line, channels of NAND strings having a memory cell being selectively erased, channels of NAND strings having any memory cells not being selectively erased, and the p-well. The process of FIG. 10 has three steps. During step 1, bit lines connected to memory cells that will be erased are charged to Vdd (approximately 2-2.5 volts) at t1. Bit lines that are connected to memory cells that will not be erased (because they are programmed, or because they are supposed to be erased and they passed the erase verify operation) remain at zero volts. The source line and SGD are also raised to Vdd at t1. The word lines, SGS and the p-well all remain at zero volts. Step 2 includes boosting the channel for the NAND strings. At time t2, the boosting voltage Vpass is applied to the unselected word lines. In one embodiment, Vpass is approximately 10 volts. Raising the unselected word lines to Vpass (at least partially) causes channel regions to be boosted for those NAND strings that have a memory cell selected to be erased. The channel regions will be boosted to approximately 6 volts (or a range of voltages near 6 volts). Because bit lines for those NAND strings are at Vdd, the select gates on the drain side become cut off which allows the channel to boost. NAND strings which do not have a memory cell selected to be erased will have their channels remain at 0 volts (or a range voltage near 0 volts). Step 3 includes applying a negative voltage to the selected word line to enable the erasing. For example, Verase (approximately −10 volts) is applied to the selected word line at t3. The negative voltage on the selected word line and the positive voltage in the boosted channel creates a large field that selectively erases those memory cells connected to the selected word line and that are on the NAND strings having boosted channels. In one embodiment, the erasing includes removing electrons from the floating gate in order to lower the threshold voltage. In one example, the electrons are transferred to the source/drain regions. In another embodiment, rather than transferring electrons off of the floating gate, there can be Gate Induced Drain Leakage (GIDL) at the junction under the selected word line/control gate to cause holes to be injected into the floating gate.

Note that the process of FIG. 10 is performed each time step 656 is performed. In one embodiment, the values of Vpass can be incremented for each iteration of step 656.

Figure 11:
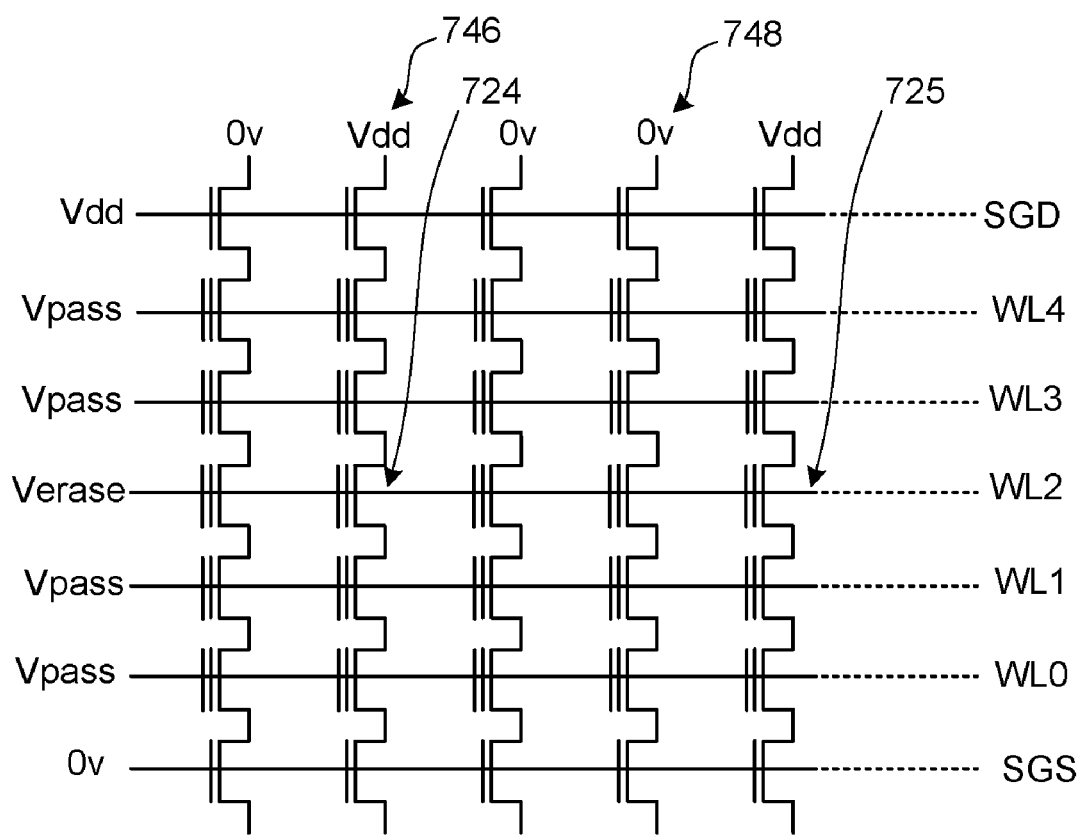
FIG. 11 depicts NAND strings during a selective erase operation.

FIG. 11 shows a set of NAND strings during step 3 of FIG. 10. As can be seen, the selected word line (WL2) receives Verase and the unselected word lines receive Vpass. In this example, memory cells 724 and 725 are selected for erasing. Memory cells 724 and 725 are both connected to WL2, the common word line. As depicted, unselected memory cells are also connected to the common word line. The bit lines for NAND strings that include memory cells to be erased receive Vdd. For example, the bit line for NAND string 746, which includes memory cell 724, is receiving Vdd. The bit lines for the NAND strings that do not have a memory cell being erased (e.g., NAND string 748) receive zero volts. Only those NAND strings with bit lines receiving Vdd will have a boosted channel. NAND strings with bit lines receiving 0 v will not have a boosted channel. Note that the NAND strings depicted in FIG. 11 are all in the same substrate region (e.g., the same p-well).

Figure 12A:
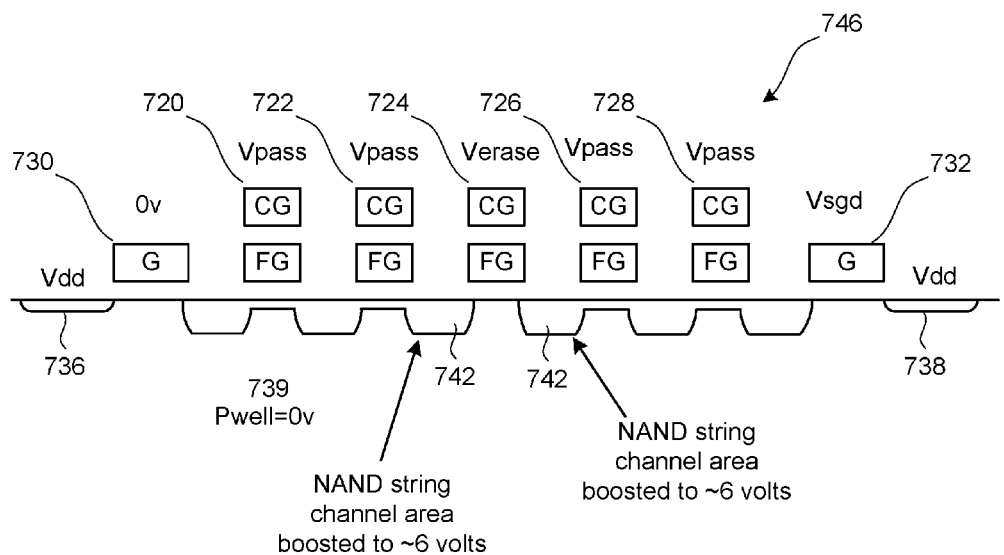
FIGS. 12A and 12B depict cross sections of NAND strings during a selective erase operation.
Figure 12B:
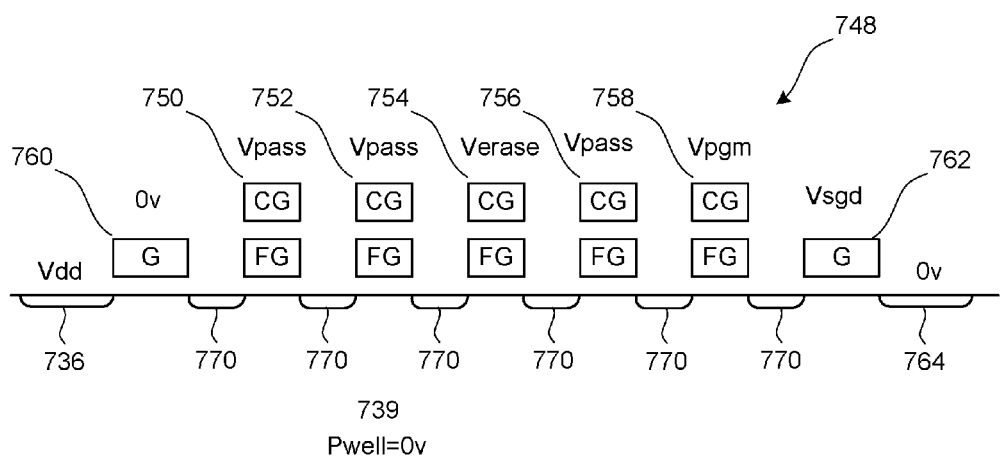

FIG. 12A shows a cross-section of NAND string 746 (representing NAND strings with memory cells that will be erased) during step 3 of the erase process depicted in FIG. 10. FIG. 12B shows a cross-section of NAND string 748 (representing NAND strings without memory cells that will be erased) during step 3 of the erase process depicted in FIG. 10. NAND string 746 of FIG. 12A includes five memory cells 720, 722, 724, 726 and 728. NAND string 746 also includes source side select gate 730, drain side select gate 732, source line 736, and bit line 738. As can be seen, memory cells 720, 722, 726 and 728 receive the Vpass at their control gates via the respective word lines. Memory cell 724, which is selected for erasing, receives Verase. Source side select gate 730 receives zero volts. Source line 736 receives Vdd and bit line 738 receives Vdd. The source/drain regions of the various memory cells of NAND string 746 and the inversion layer underneath the floating gates (except for underneath the floating gate of memory cell 724) form an equipotential region referred to as the channel region 742 for NAND string 746. This channel region 742, depicted in FIG. 12A, is boosted to 6 volts. The boosted channel region 742 is graphically depicted at the top of the p-well region 739. There is a gap in the channel region boosting area below the floating gate of memory cell 724.

FIG. 12B shows NAND string 748 (see FIG. 11), which does not include memory cells selected for erasing. NAND string 748 includes memory cells 750, 752, 754, 756 and 758. NAND string 748 also includes source side select gate 760, drain side select gate 762, source line 736, bit line 764, and source/drain regions 770. As can be seen, bit line 764 receives zero volts which prevents the drain side select gate 762 from cutting off; therefore, the channel region of the NAND string does not boost in the manner as depicted in FIG. 12A. FIGS. 11, 12A and 12B depict how some memory cells connected to a common word line can be selected for erasing while other memory cells connected to the same word line will not be erased.

In some embodiments, using a negative word line voltage requires a triple well structure for the row decoder and a negative pump to supply the voltage. In some cases, such an arrangement can be expensive. FIG. 13 is a flowchart describing another embodiment of a process for performing selective erase operations on a subset of memory cells connected to a word line. The process of FIG. 13, which can be performed during step 656 of FIG. 9, includes four steps. In step 800, bit lines for memory cells that are to be erased will be charged up to Vdd and bit lines for memory cells that will not be erased are maintained at zero volts. In step 802, the p-well and all word lines of the entire plane will be charged to a voltage Vwell (e.g. approximately 10 volts). This will couple the bit lines by the voltage Vwell. The bit lines that were charge up to Vdd will maintain the voltage difference as compared to bit lines that were at 0 volts. The p-well charging can be offset (as compared to the word line) by a diode drop (or more than a diode drop) to prevent forward biasing of the bit line junction. In step 804, the word lines for the block of memory cells selected to erasing will be charged up to Vwell+Vpass (approximately 17 volts) in order to boost the channel for the NAND strings having memory cells that will be erased. The boosted channel will be at approximately 15 volts. At step 806, the selected memory cells will be erased by lowering the selected word line to zero volts.

FIG. 14 is a timing diagram which provides more detail of the process of FIG. 13. FIG. 14 shows the same four steps as FIG. 13. In the first step (Precharging Bit Lines—step 800), the bit lines for those memory cells that will be erased are raised to Vdd, the common source line is raised to Vdd, the bit lines that are not connected to NAND strings with memory cells that will be erased remain at 0 volts, and all other signals depicted in FIG. 14 also remain at zero volts.

In the second step (Charge WL and Well—step 802), the unselected and selected word lines are charged up from 0 volts to Vwell at time t2. Additionally, at t2 SGD is raised from 0 volts to Vwell+2V and SGS is raised from 0 volts to Vwell. The raising of the word lines to Vwell causes the bit lines to couple to Vwell+Vdd (approximately 10 volts) for bit lines associated with memory cells to be erased. Bit lines not associated with memory cells to be erased remain will be at Vwell. At t2, the p-well is also raised to Vwell which causes the channels for the NAND strings to be raised to Vwell.

In the third step (Boost Erase Channel—step 804), the unselected and selected word lines for the entire block are raised to Vwell+Vpass (approximately 17 volts) at time t3, which causes (at least partially) the boosting of the channel regions for NAND strings of memory cells to be erased to be boosted to Vwell+the boosting voltage (e.g., approximately 15 volts) or a range of voltages near that level. This boosting is occurring because the drain side select gate is cut off due to the bit lines of the selected memory cells being at Vwell+Vdd. Since the bit lines of unselected memory cells are only at Vwell, those drain side select gates do not cut off and the NAND strings channels for memory cells not to be erased will not be boosted to Vwell+the boosting voltage, but will remain at Vwell or a range of voltages near that level.

In step four, the selected word line has its voltage lowered to zero volts at time t4 to enable the erasing. The memory cells selected for erase will have 15 volts across the control gate and channel, which provides conditions suitable for erasing. The unselected memory cells in the same NAND string will have 17 volts at the word line and 15 volts at the channel, which does not provide conditions suitable for erasing. The unselected memory cells on the same selected word line will have zero volts at the control gate and 10 volts at the channel, which does not provide conditions suitable for erasing. In one embodiment, the erasing includes removing electrons from the floating gate to lower the threshold voltage. In one example, the electrons are transferred to the channel region.

In another embodiment, rather than transferring electrons off of the floating gate, there can be Gate Induced Drain Leakage (GIDL) at the junction under the selected word line/control gate to cause holes to be injected into the floating gate.

FIG. 15 shows an example set of NAND strings during step 806 of FIG. 13, in which memory cell 854 (on NAND string 830) and memory cell 855 are selected for erasing. Although FIG. 15 only shows two memory cells being selectively erased, in other examples, more or less memory cells connected to the same common selected word line (WL2) can be selected for erasing. The selective erasing allows for less than all memory cells connected to a selected word line to be selected for erasing. As can be seen, the bit lines for NAND strings with memory cells that will be erased (e.g., NAND string 830) is at Vwell+Vdd, while the other NAND strings that do not have a memory cell to be erased (e.g., NAND string 832) have bit lines at Vwell. The selected word line receives zero volts while the unselected word lines receive Vwell+Vpass. Note that the NAND strings depicted in FIG. 15 are all in the same substrate region (and, thus, are on the same p-well).

Figure 16A:
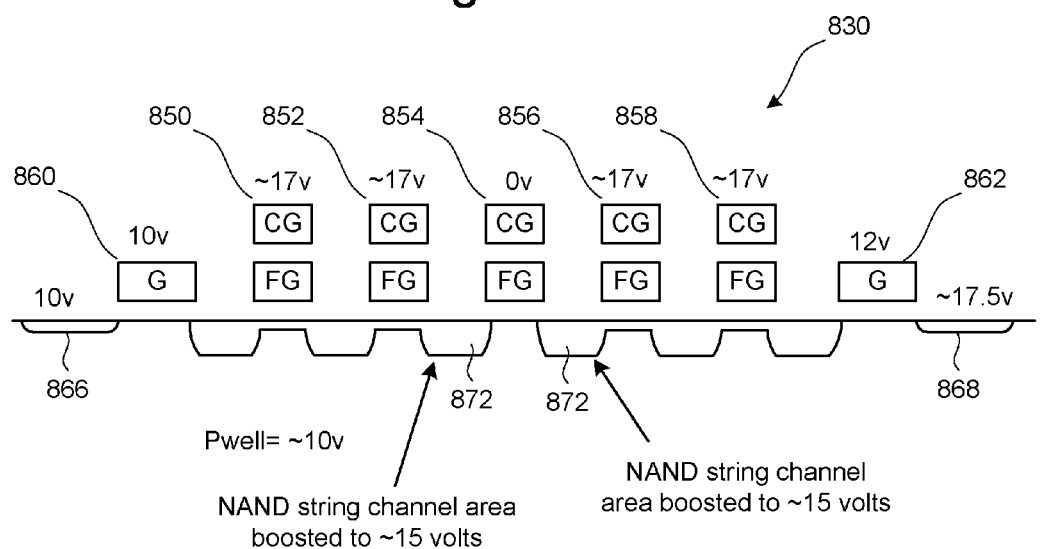
FIGS. 16A and 16B depict cross sections of NAND strings during a selective erase operation.

FIG. 16A shows cross-sections of NAND string 830 (representing NAND strings with memory cells that will be erased) during step 806 of FIG. 13. NAND string 830 includes memory cells 850, 852, 854, 856 and 858. NAND string 830 also includes source side select gate 860, drain side select gate 862, source line 866, and bit line 868. FIG. 16A shows the boosted channel area 872, which is boosted to approximately 15 volts.

Figure 16B:
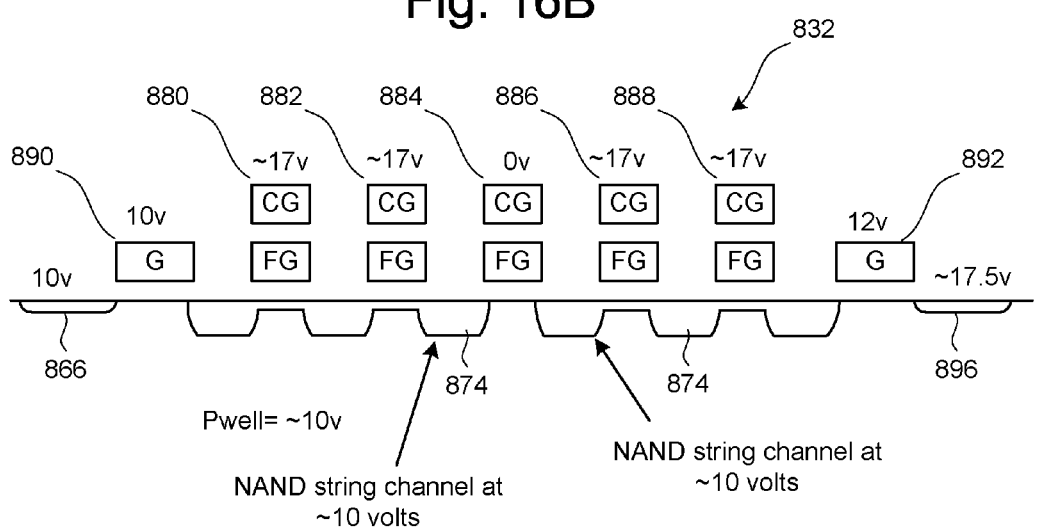

FIG. 16B shows a cross-section of NAND string 832 (representing NAND strings without memory cells that will be erased) during step 806 of FIG. 13. NAND string 832 includes memory cells 880, 882, 884, 886 and 888. NAND string 832 also includes source side select gate 890, drain side select gate 892, common source side line 866 and bit line 896. NAND string 832 includes a boosted channel region 874. However, this boosted channel region is only boosted to approximately 10 volts, as discussed above; therefore, erasing does not intentionally occur.

Looking back at FIG. 9, step 656 includes performing one or more erase operations on memory cells that are selected for erasing. In the embodiments of FIGS. 10 and 14, one erase operation is performed on the selected memory cells during each iteration of step 656. In other embodiments, multiple erase operations can be performed (with or without performing an intervening verify operation) in each iteration of step 656. Furthermore, one variation of the four step operation depicted in FIGS. 13 and 14 can include precharging the bit lines (800) and charging the word lines (802) only once, and then repeating the boosting the channel (804) and the erasing (806) multiple times.

Figure 17:
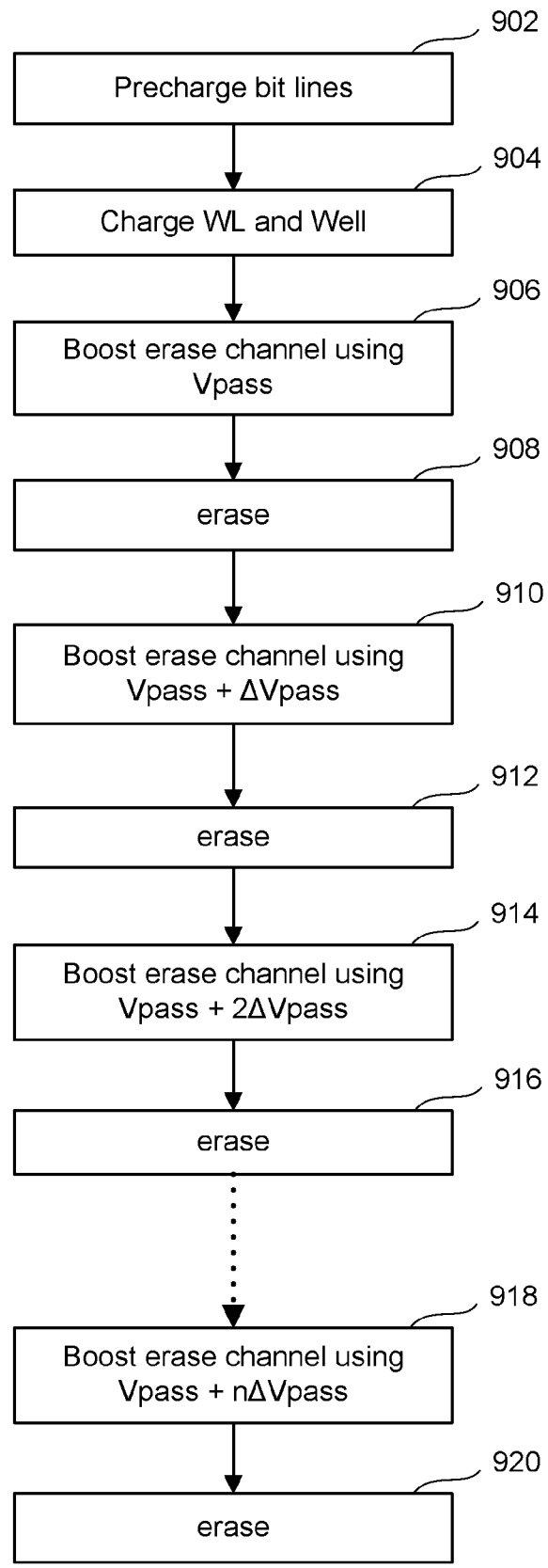
FIG. 17 is a flow chart describing one embodiment of a process for selective erasing non-volatile storage using multiple erase pulses without an intervening verify operation.

FIG. 17 is a flowchart describing one embodiment of a process for performing multiple erase operations, while precharging the bit lines and charging the word lines only once. In step 902 of FIG. 17, the bit lines are charged up as performed in step 800 of FIG. 13. In step 904, the word lines and well are charged, as performed in step 802 of FIG. 13. In step 906 of FIG. 17, the raised channel is boosted as performed in step 804 of FIG. 13. Note that the unselected word lines receive Vpass in step 906. In step 908, the selected word line is lowered to zero volts and electrons are removed from the floating gate. In step 910, the erase channel is boosted again. Step 910 is similar to step 804 of FIG. 13; however, unselected word lines and selected word line will receive Vwell+Vpass+ΔVpass. In one example, ΔVpass can be anywhere from 0.2 to 0.5 volts. In step 912, the selected word line is lowered to zero volts and the memory cells are erased as electrons are transferred out of the floating gate. Step 912 is similar to step 806. In step 914, the erase channel is boosted (similar to step 804); however, the word lines will receive Vwell+Vpass+2ΔVpass. Future iterations will use 3ΔVpass, 4ΔVpass, etc. At step 916, the selected word line is lowered to zero volts and the selected memory cells are erased as electrons are transferred out of the floating gate, similar to step 806. The boosting and erasing are repeated until steps 918 and 920, respectively. The process of FIG. 17 shows that after precharging the bit lines (step 902) and charging the word lines (step 904) once, the boosting of the erase channel and the erasing process can be repeated multiple times without having to precharge the bit lines and charge the word lines again. The repeating of the boosting of the erase channel and the erasing process can be done two or more times. There is no specific number of repeats that are necessary.

Figure 18:
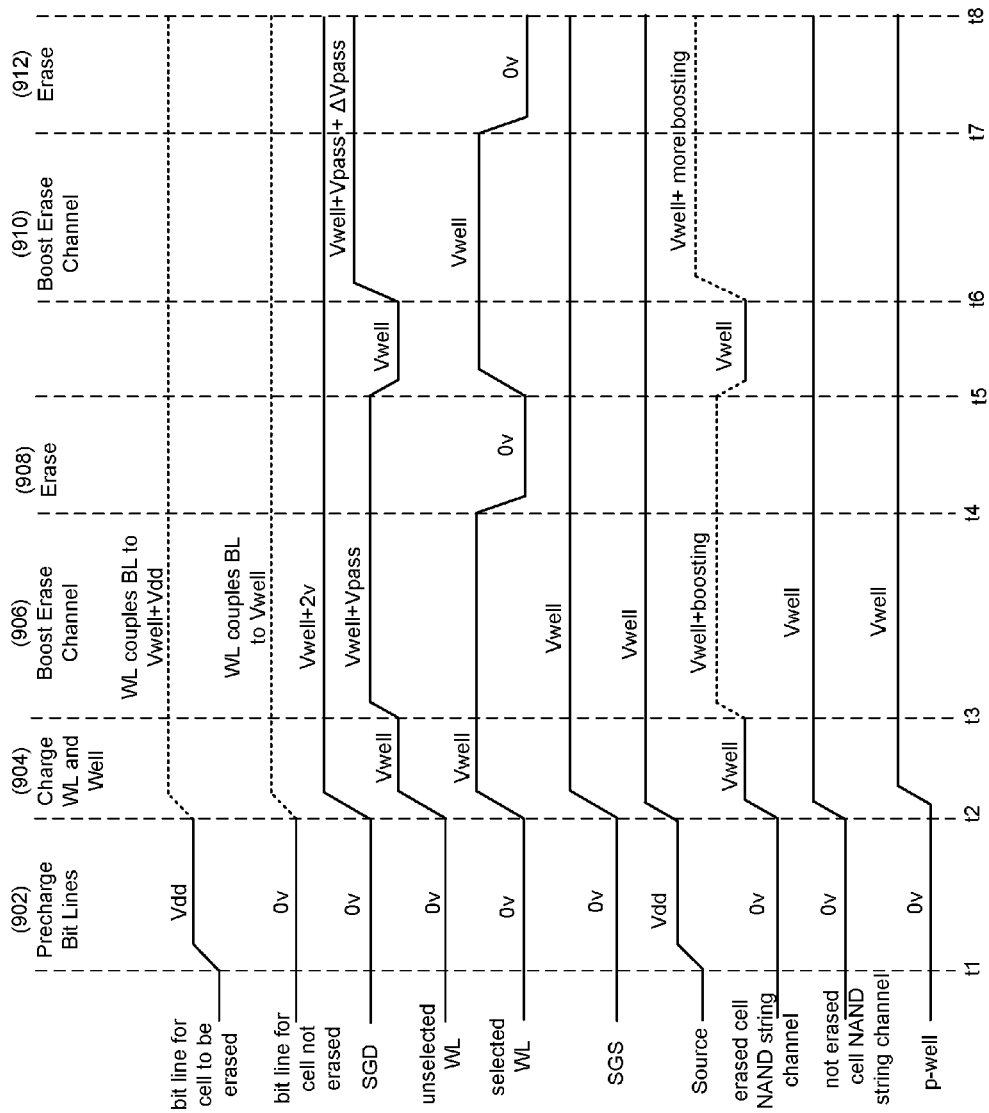
FIG. 18 is a timing diagram for selective erasing non-volatile storage using multiple erase pulses without an intervening verify operation.

FIG. 18 is a timing diagram that graphically depicts steps 902-912 of FIG. 17. One skilled in the art would know how to use the teachings of FIG. 18 to extrapolate and perform the other steps of FIG. 17. As can be seen from FIG. 18, the bit line for the memory cell to be erased is initially precharged with Vdd at t1 (902). The bit line for the memory cell to be erased couples up to Vwell+Vdd at t2 (904) and remains at that level through t8. The bit line for memory cells not to be erased couple up to Vwell at t2 and remain there through t8. SGD is raised from zero volts to Vwell+2 volts (or Vdd) at t2 and remains there through t8. The unselected word lines are raised from zero volts to Vwell at t2 and then to Vwell+Vpass at t3 (906). After step 908, at the unselected word lines are lowered to Vwell t5 as part of the recovery phase. When the boosting of the channel is performed again in step 910 the unselected word lines are raised to Vwell+Vpass+ΔVpass, as described above. Future iterations of the process of FIG. 17 will raise the unselected word lines to Vwell+Vpass+nΔVpass. The selected word line is raised to Vwell at t2 (904) and then lowered down to the erase voltage zero volts at t4 (908). During the recovery phase at t5, between erasing and the next boosting, the selected word line will be raised again to Vwell. The selected word line will be lowered to 0 volts at t7 to enable the selective erasing (912). This process will continue raising the selected word line to Vwell for the boosting erase channel phase and then lower it down to zero volts for the completion of the erase operation. SGS is raised to Vwell from zero volts at time t2 and stays there through t8. The common source line is raised to Vdd at t1 and then to Vwell at t2, where it stays through t8. The p-well is raised to Vwell at t2 and stays there through t8. As a result of raising the p-well to Vwell at t2, the channels of all the NAND strings are raised to Vwell at t2 also (904). The channel of a NAND string that is supposed to be erased will be boosted up to Vwell+a boosting voltage at t3 (906), lowered down to Vwell at t5 and then raised up to Vwell+the additional boosting level at t6 (910). That channel will continue to switch between Vwell and Vwell+boosting during the process of FIG. 17.

In one embodiment, the selective erasing can be performed as part of a two (or more) phased erase process that includes a coarse phase and a fine phase. During the course phase, the process of FIG. 17 can be performed with two or more erase operations performed with no verifying between erase operations. After a predetermined number of erase operations, the coarse phase will be completed. The fine phase will then commence by performing the process of FIG. 9, where the process of FIG. 14 is used to implement step 656. The coarse phase erases faster, but with less precision. The fine phase erases slower but with more precision.

During programming, one solution for achieving tight threshold voltage distributions without unreasonably slowing down the programming process is to use a two (or more) pass programming process. The first pass, a coarse programming phase, includes attempts to raise the threshold voltage in a faster manner paying relatively less attention to achieving a tight threshold voltage distribution. The second pass, a fine programming phase, attempts to raise the threshold voltage in a slower manner in order to reach the target threshold voltage while also achieving a tighter threshold voltage distribution.

Figure 19:
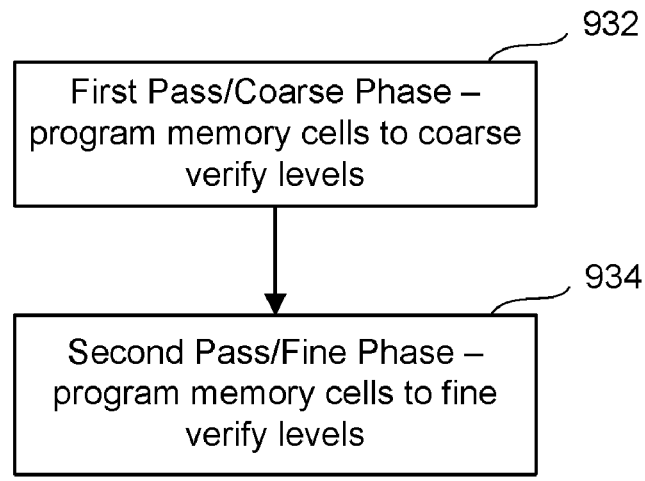
FIG. 19 is a flow chart describing one embodiment of a two pass programming process.

FIG. 19 is flow chart describing one embodiment of a two pass programming process. In step 932, the first pass is performed. In one embodiment, the first pass is a coarse programming phase. The selected memory cells will be programmed to one or more coarse verify levels. Once all of the selected memory cells have reached their respective coarse verify level, then the coarse programming phase will be complete. In step 934, the second pass is performed. In one embodiment, the second pass is a fine programming phase that is performed after the coarse programming phase has completed. The selected memory cells will be programmed to one or more fine verify levels. Once all of the selected memory cells have reached their respective fine verify level, then the fine programming phase will be complete. In some embodiments, the program pulses applied to the word lines will be longer or higher in magnitude for the coarse phase, as compared to the fine phase. In other embodiments, the bit line voltage for the coarse phase will be at 0 volts and the bit line voltage for the fine phase will be at a level (e.g., ~1 volt) between 0 volts and Vdd. Various alternatives and embodiments of the coarse/fine programming methodology can also be used. In some embodiments, there can be more than one coarse phase and/or more than one fine phase. Other types of multiple pass programming processes, including process different than coarse/fine and including processes having more than two passes, can also be used.

Figure 20:
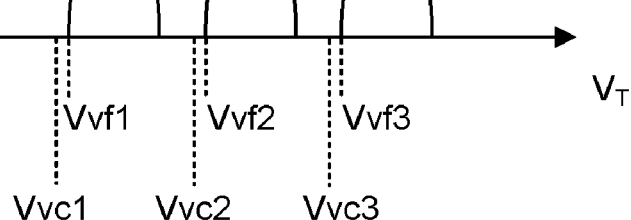
FIG. 20 depicts threshold voltage distributions.

FIG. 20 shows a set of threshold voltages distributions associated with data states S0, S1, S2 and S3. For each data state, the coarse verify level (Vvc) is depicted and the fine verify level (Vvf) is depicted. For example, during the coarse phase for memory cells being programmed to data state S1, the verify level will be VVc1 and during the fine phase memory cells will be verified against Vvf1. Memory cells programmed to data state S2 will be verified during the coarse phase against Vvc2 and during the fine phase against Vvf2. Memory cells being programming to state S3 will be verified during the coarse phase against Vvc3 and during the fine phase against Vvf3.

The method of operation depicted in FIG. 7, discussed above, contemplates an embodiment where the memory cells are programmed and, after completing programming, the selective erase process is performed. In another embodiment, the programming process and the selective-erasing processes can be performed in an intermingled fashion. For example, the selective erasing can be performed after the coarse phase of programming and prior to the fine phase of programming. In another embodiment, the selective erasing can be performed after programming some data and prior to programming other data.

Figures 21, 22:
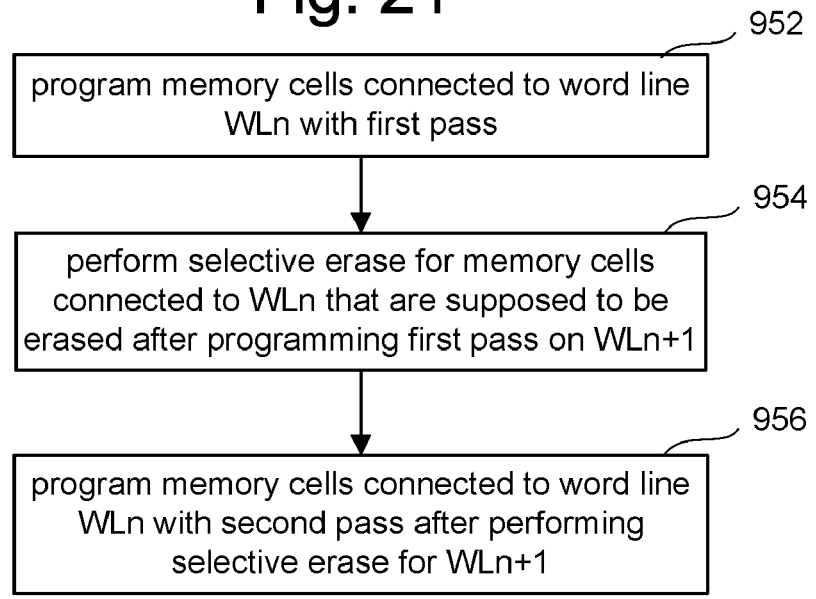
FIG. 21 is a flow chart describing one embodiment of a process for programming and selectively erasing non-volatile storage.
FIG. 22 is a table that describes the order for programming and selectively erasing non-volatile storage.

FIG. 21 is a flowchart describing one embodiment for intermingling a two pass programming process and the selective erasing process. In one embodiment, the two pass programming process is a coarse/fine programming process where the first pass is the coarse phase and the second pass is the fine phase. Other two pass programming processes can also be used. In the embodiment of FIG. 21, the selective erase process is performed between the first pass and the second pass in order to re-erase memory cells that have had their threshold voltage moved in error. In this embodiment, the selective erase process is performed also after neighboring word lines have been programmed according to the first pass of the two pass programming process. This order of operation will reduce the effects of coupling from neighboring memory cells.

FIG. 21 explains the process from the point of view of memory cells on a word line WLn. In step 952 of FIG. 21, memory cells connected to word line WLn are programmed according to the first pass (e.g. coarse phase) of the two pass programming process. In step 954, the memory cells connected to word line WLn are subjected to the selective erase processes described above in order to re-erase those memory cells that are supposed to be erased but have a threshold voltage that was raised above the erase threshold distribution. Step 954 includes performing the process of FIG. 9. However, the process of step 954 is performed after programming the first pass of the two pass programming process on memory cells connected to neighbor word line WLn+1. Thus, if step 952 includes programming memory cells on word line WL1, then the selective erase of step 954 will be performed after doing the coarse phase for the memory cells on word line WL2. In step 956, the second pass of the two pass programming process will be performed on memory cells connected to WLn, after performing the selective erase process for word line WLn+1. In one embodiment, the process of FIG. 21 is performed for all the word lines in a block. In other embodiments, the process can be performed on only a subset of word lines.

FIG. 22 is a table which shows the order of programming the first pass of the two pass programming process, the second pass of the two pass programming process and the selective erase process for memory cells on five word lines. Initially, the first programming pass is performed for WL0. Subsequently, the first programming pass is performed for word line WL1, followed by the selective erase process for word line WL0, followed by the first programming pass for word line WL2, followed by selective erase process for word line WL1, followed by second programming pass for WL0 followed by first programming pass for WL3 followed by selective erase process for WL2, followed by second programming pass for WL1, followed by first programming pass for WL4, followed by selective erase process for WL3, followed by second programming pass for WL2, etc. The order of operation depicted in FIG. 22 can be extrapolated to more than five word lines.

Figure 23:
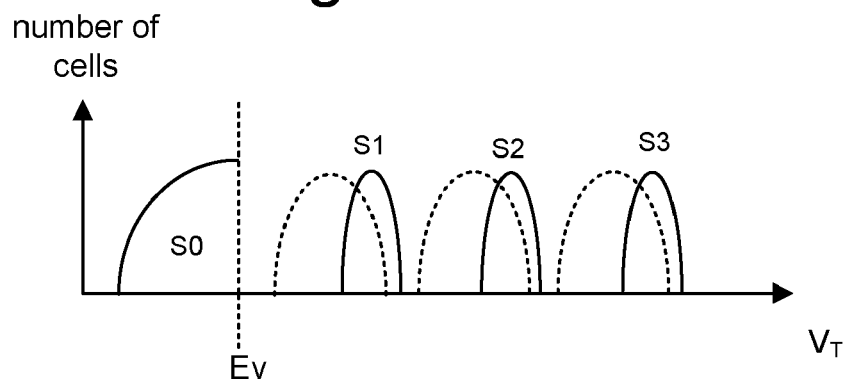
FIG. 23 depicts threshold voltage distributions.
Figure 24:
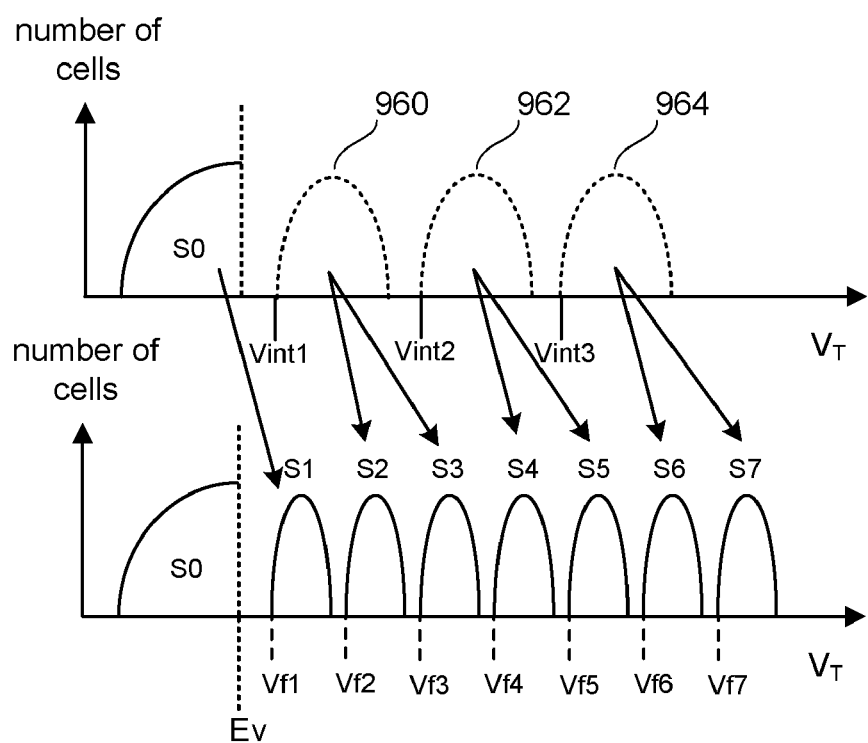
FIG. 24 depicts threshold voltage distributions.

FIG. 23 shows a set of threshold voltage distributions that result from a programming process according to FIGS. 21 and 22. State S0, S1, S2 and S3 (which represent the final threshold voltage distributions after the fine phase) are depicted. Behind each of states S1, S2 and S3 are threshold voltage distributions that are in dashed lines, which represent the corresponding threshold voltage distributions after the coarse phase. As can be seen, the final distributions (which result from the fine phase) are much narrower and slightly higher.

In another embodiment, the two pass programming technique of FIGS. 21 and 22 can be used to program data to eight data states S0-S7. During the first pass, memory cells will be programmed to threshold voltage distributions 960, 962, and 964 using verify points Vint1, Vint2, and Vint3, respectively. During the second pass of the programming process, memory cells can be moved to one of two possible data states. Memory cells that are in data state S0 can remain in S0 or can be programmed to data state S1 using verified point Vf1. Memory cells in threshold voltage distribution 960 can be programmed to either data state S2 or data state S3 using verified point Vf2 and Vf3, respectively. Memory cells in threshold voltage distribution 962 can be programmed to either data state S4 or data state S5 using verified point Vf4 and Vf5, respectively. Memory cells in threshold voltage distribution 964 can be programmed to either data state S6 or data state S7 using verified point Vf6 and Vf7, respectively. After the first pass and prior to the second pass, a selective erase process is performed, as described above with respect to FIG. 21 and/or 22.

When memory cells are programmed, whether they use a single pass or a multiple pass programming process, it is possible that some memory cells become over programmed. For example, a memory cell intended to be programmed to data state S2 may have its threshold voltage raised to a level which is greater than the threshold voltage distribution for state S2. FIG. 25 shows a set of threshold voltage distributions that have some over programmed memory cells. As can be seen, data states S1-S7 have tails on the right hand side of their threshold voltage distributions. These tails represent over programmed memory cells. Also depicted on the graph of FIG. 25 are over programmed verify points (Vop1, Vop2, Vop3, Vop4, Vop5, Vop6, and Vop7). Those memory cells in a particular threshold voltage distribution having a threshold voltage greater than the associated over programming verify point are considered to be over programmed.

In some devices the lower data states (e.g., S1, S2, S3) experience more over programming than the upper states. In some devices the upper states do not experience over programming.

In one embodiment, the selective erase processes described above with respect to FIGS. 10-18 can be used to correct over programmed memory cells. FIGS. 26A and 26B provide two example processes for using the selective erasing method described above to correct over programmed memory cells.

In step 1002 of FIG. 26A, memory cells are pre-programmed (similar to step 550 of FIG. 7). In step 1004, a block (or other unit) of memory cells is erased (similar to step 552 of FIG. 7). In step 1006, memory cells may be optionally soft programmed (similar to step 554 of FIG. 7). In step 1008, the memory cells are programmed using any of various suitable programming processes known in the art. In step 1010, over programmed memory cells are corrected. Thus, the process of 26A will correct over programmed memory cells after completing the programming of step 1008.

The process of FIG. 26B will intermingle the programming of memory cells and the correcting of over programmed memory cells during the programming process. In step 1002, the block of memory cells are pre-programmed. In step 1004, the block (or other unit) of memory cells is erased. In step 1006, the memory cells are optionally soft programmed. In step 1020, memory cells are programmed and those memory cells that are over programmed are corrected using the selective erase process such that the programming and selective erasing is performed in an intermingled manner. More details are provided below.

Figure 27:
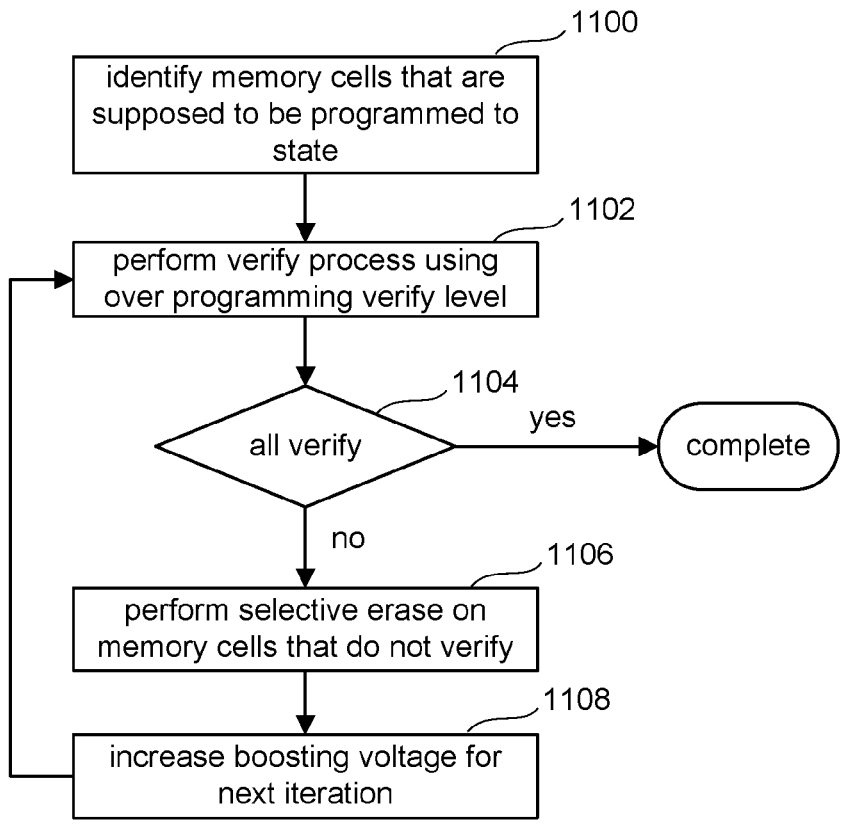
FIG. 27 is a flow chart describing one embodiment of a process for correcting for over programming by using a selectively erase process.

FIG. 27 is a flowchart describing one embodiment for correcting over programmed memory cells. In one embodiment, the method of FIG. 27 is performed for one data state at a time. For example, the method of FIG. 27 can be performed for S1. Subsequently, the method of FIG. 27 can be performed for S2, and so on. In step 1100, the system will identify memory cells that are supposed to be programmed to the data state under consideration. As discussed above, this information can be found by obtaining information from the controller, obtaining the information from a buffer (RAM or non-volatile memory), or obtaining the information from data latches 494. In step 1102, a verify process is performed using the appropriate over programmed verify level (e.g., Vop1, Vop2, Vop3, Vop4, Vop5, Vop6, or Vop7) associated with the data state under consideration. For example, if the process of FIG. 12 is being performed for data state S1, then the verification process of step 1102 will be performed using VOP1. The voltage of VOP1 will be applied to the control gate (via word line) of the memory cells to determine whether they are over programmed for data state 1. If all the memory cells are not over programmed and all verify correctly (step 1104), then the process of FIG. 27 is complete. Alternatively, if enough memory cells verify properly, then the process can be considered complete. If all the memory cells do not verify properly (step 1104), then a selective erase operation is performed so that those memory cells that did not verify in step 1102 are selectively subjected to one or more erase operations to reduce their threshold voltage so that the threshold voltage will be lower than the appropriate over programmed verify level. The processes of FIGS. 10-18 can be used to implement step 1106. In step 1108, the boosting voltage (Vpass) is incremented for the next iteration of steps 1102-1108, and the process loops back to step 1102 and performs a verification process. The loop 1102-1108 will be repeated until all or a predetermined number of memory cells have successfully verified. As memory cells verify in step 1102, they are locked out of further erasing.

In one implementation, the process of FIG. 27 is performed during step 1010 of FIG. 26A. In one embodiment, the process of FIG. 27 is to be performed separately for each program state so that if there are seven program states (S1-S7) then the process of FIG. 27 will be performed seven times during step 1010 of FIG. 26A and if there are three program states (S1-S3), then the process of FIG. 27 will be performed three times during step 1010 of FIG. 26A. In another embodiment, the process of FIG. 27 can be performed concurrently for all data states such that step 1100 will identify what data state each memory cell should be in and step 1102 will include performing a verify operation for each data state and the local processor 482 will keep track of which of the verify operations to store the result for. This way the process of FIG. 27 can be performed only once.

Figure 28:
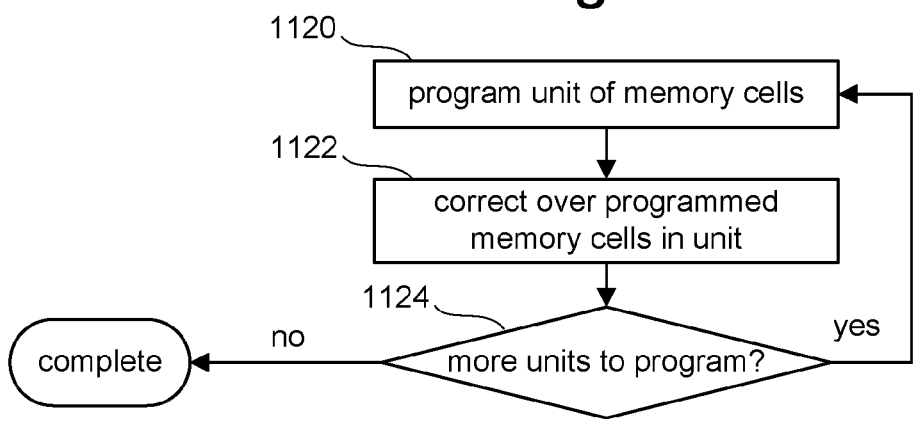
FIG. 28 is a flow chart describing one embodiment of a process for correcting over programming during a programming process.

FIG. 28 provides one example of an implementation of step 1020 of FIG. 26B. In step 1120, a unit of memory cells is programmed. The programming can include programming one bit of data per memory cell, two bits of data per memory cell, three bits of data per memory cell, etc. In one embodiment, the unit of memory cells can be all memory cells connected to a common word line, all memory cells in a page, all memory cells in a sector, or other unit. In step 1122, the system will correct over programmed memory cells of the unit of memory cells that were programmed in the most recent iteration of step 1120. Step 1122 can be implemented using the process of FIG. 27. For example, step 1122 can include performing the process of FIG. 27 once for each data state. Alternatively, step 1122 can include performing the process of FIG. 27 once concurrently for all data states, as discussed above. In step 1124, it is determined whether there are any more units to program. If not, the process is complete. If there are more units to program, then the method of FIG. 28 loops back to step 1120 and programs the next unit of memory cells and then will correct over programmed memory cells for that unit of memory cells in step 1122. The iteration of steps 1120 and 1122 will be repeated for all the units of memory cells that need to be programmed.

In some embodiments over programming is a greater problem for the lower states; therefore, the system will only correct over programming for lower states.

In some embodiments, the selective erase process can be used to correct over programming without performing erase-verifies between each iteration of selective erasing. For example, step 1106 of FIG. 27 can be performed multiple times without performing step 1102. One such implementation uses the process of FIGS. 17 and 18.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:
    erasing non-volatile storage elements;
    performing programming for said non-volatile storage elements; and
    selectively performing re-erasing of a first subset of non-volatile storage elements that were supposed to remain erased without intentionally erasing programmed data by performing one or more erase operations for the first subset of non-volatile storage elements that were supposed to remain erased comprising
    boosting a first set of channel regions to a first voltage range for the first subset of non-volatile elements that were supposed to remain erased without boosting a second set of channel regions to said first voltage range for a second subset of non-volatile elements that were supposed to be programmed, said first set of channel regions and said second set of channel regions are part of a common substrate region,
    applying a boosting enabling voltage to said first subset of non-volatile storage elements,
    applying a boosting disabling voltage to said second subset of non-volatile storage elements,
    charging said common substrate region,
    applying a voltage signal to an unselected common control line for coupling said first subset and said second subset of non-volatile storage elements to said unselected common control line,
    applying a boosting signal beyond said voltage signal to said unselected common control line to boost said first set of channel regions, and
    applying a common enabling voltage to said first subset of non-volatile storage elements and said second subset of non-volatile storage elements in order to lower threshold voltages of said first subset of non-volatile storage elements without intentionally lowering threshold voltages of said second subset of non-volatile storage elements.

2. A method according to claim 1, wherein said selectively performing re-erasing of a first subset of non-volatile storage elements that were supposed to remain erased further comprises:
    identifying which non-volatile storage elements that should remain erased as the first subset of non-volatile storage elements;
    testing whether said non-volatile storage elements that were supposed to remain erased appear to have been altered past a threshold; and
    performing one or more erase operations for the first subset of non-volatile storage elements that should remain erased and appear to have been altered past said threshold.

3. A method according to claim 1, wherein:
    said non-volatile storage elements are NAND flash memory devices and said common control line is a common word line.

4. A method according to claim 1, wherein:
    said performing programming for said non-volatile storage elements comprises receiving data to be stored by said non-volatile storage elements, said data indicates that a first subset of said non-volatile storage elements are to remain erased and a second subset of said non-volatile storage elements are to be programmed, said performing programming changes threshold voltages for said second subset of said non-volatile storage elements and attempts to not change threshold voltages for said first subset of non-volatile storage elements.

5. A method according to claim 1, wherein:
    said first subset of non-volatile storage elements are flash memory devices that are connected to a common word line and are each part of a different NAND string.

6. A method according to claim 1, wherein said performing programming for said non-volatile storage elements and selectively performing re-erasing of at least said subset of non-volatile storage elements comprises:
    performing a first pass of a first multi-pass programming process for non-volatile storage elements connected to a first control line;
    performing a first pass of a second multi-pass programming process for non-volatile storage elements connected to a second control line;
    after performing said first pass of said second multi-pass programming process, selectively performing re-erasing of at least a subset of said non-volatile storage elements connected to said first control line that were supposed to remain erased;
    selectively performing re-erasing of at least a subset of said non-volatile storage elements connected to said second control line that were supposed to remain erased;
    after selectively performing re-erasing of at least a subset of said non-volatile storage elements connected to said first control line, performing a second pass of said first multi-pass programming process for at least some of said non-volatile storage elements connected to said first control line; and
    performing a second pass of said second multi-pass programming process for at least some of said non-volatile storage elements connected to said second control line.

7. A method according to claim 6, wherein:
said first pass of said first multi-pass programming process is a coarse stage of said first multi-pass programming; and
said second pass of said first multi-pass programming process is a fine stage of said first multi-pass programming.

8. A method according to claim 6, wherein:
said first pass of said first multi-pass programming process causes said non-volatile storage elements connected to said first control line to be in a first number of data states; and
said second pass of said first multi-pass programming process causes said non-volatile storage elements connected to said first control line to be in a second number of data states, said second number of data states is greater than said first number of data states.

9. A method according to claim 6, further comprising:
performing a first pass of a third multi-pass programming process on non-volatile storage elements connected to a third control line;
selectively performing re-erasing of at least a subset of said non-volatile storage elements connected to said third control line that were supposed to remain erased; and
performing a second pass of said third multi-pass programming process for said non-volatile storage elements connected to said third control line;
wherein said selectively performing re-erasing of at least a subset of said non-volatile storage elements connected to said second control line is performed after performing said first pass of said third multi-pass programming process.

10. A method according to claim 6, wherein:
said first pass of said first multi-pass programming process and said second pass of said first multi-pass programming process program a common set of data.

11. A method according to claim 1, wherein said performing programming for said non-volatile storage elements and selectively performing re-erasing of at least a subset of non-volatile storage elements comprises:
performing a first pass of a first multi-pass programming process for said non-volatile storage elements connected to a first control line;
performing a first pass of a second multi-pass programming process for said non-volatile storage elements connected to a second control line after performing said first pass of said first multi-pass programming process;
after performing said first pass of said second multi-pass programming process, selectively performing re-erasing of at least a subset of said non-volatile storage elements connected to said first control line that were supposed to remain erased;
after selectively performing re-erasing of at least a subset of said non-volatile storage elements connected to said first control line, selectively performing re-erasing of at least a subset of said non-volatile storage elements connected to said second control line that were supposed to remain erased;
after selectively performing re-erasing of at least a subset of said non-volatile storage elements connected to said second control line, performing a second pass of said first multi-pass programming process for at least some of said non-volatile storage elements connected to said first control line; and
after performing said second pass of said first multi-pass programming process, performing a second pass of said second multi-pass programming process for at least some of said non-volatile storage elements connected to said second control line.

12. A method according to claim 1, wherein:
said non-volatile storage elements are connected to a common word line;
said performing programming and said selectively performing re-erasing are performed on a word line basis; and
said erasing is performed on a block basis.

13. A method for operating non-volatile storage, comprising:
erasing a set of non-volatile storage elements, said non-volatile storage elements are flash memory devices connected to a common word line;
receiving data to be stored by said set of non-volatile storage elements, said data indicates that some of said non-volatile storage elements are to be programmed and some of said non-volatile storage elements are to remain erased;
programming said data into said set of non-volatile storage elements; and
selectively performing re-erasing of at least a first subset of non-volatile storage elements that were supposed to remain erased without intentionally erasing any non-volatile storage elements in a second subset storing properly programmed data by
applying non-negative boosting signals to unselected word lines for said set of non-volatile storage elements;
applying a boosting enabling voltage to bit lines for said first subset of non-volatile storage elements;
applying a boosting disabling voltage to bit lines for said second subset of non-volatile storage elements; and
applying a non-negative voltage to said common word line.

14. A method according to claim 13, wherein:
said set of non-volatile storage elements include floating gates;
said programming said data into set of non-volatile storage elements includes adding charge to floating gates indicated by said data to change state and not adding charge to floating gates indicated by said data to not change state.

15. A method according to claim 13, wherein:
said first subset of non-volatile storage elements are each part of different NAND strings.

16. A method according to claim 13, wherein programming said data into said set of non-volatile storage elements and selectively performing re-erasing comprises:
performing a first pass of a first multi-pass programming process for non-volatile storage elements connected to a first control line;
performing a first pass of a second multi-pass programming process for non-volatile storage elements connected to a second control line;
after performing said first pass of said second multi-pass programming process, selectively performing re-erasing of at least a first subset of said non-volatile storage elements connected to said first control line that were supposed to remain erased;
selectively performing re-erasing of at least a third subset of said non-volatile storage elements connected to said second control line that were supposed to remain erased;
after selectively performing re-erasing of at least said first subset of said non-volatile storage elements connected to said first control line, performing a second pass of said first multi-pass programming process for non-volatile storage elements connected to said first control line; and performing a second pass of said second multi-pass programming process for non-volatile storage elements connected to said second control line.

17. A method according to claim 16, wherein:

said first pass of said first multi-pass programming process is a coarse stage of said first multi-pass programming; and said second pass of said first multi-pass programming process is a fine stage of said first multi-pass programming.

18. A method according to claim 16, wherein:

said first pass of said first multi-pass programming process causes said non-volatile storage elements connected to said first control line to be in a first number of data states; and said second pass of said first multi-pass programming process causes said non-volatile storage elements connected to said first control line to be in a second number of data states, said second number of data states is greater than said first number of data states.

19. A method for operating non-volatile storage, comprising:

erasing non-volatile storage elements;

performing programming for said non-volatile storage elements; and selectively performing re-erasing of a subset of groups of non-volatile storage elements that were supposed to remain erased and which are connected to a common first set of control lines without intentionally erasing programmed data, each group includes multiple non-volatile storage elements in series and sharing a common channel area, by performing one or more erase operations for the subset of groups of non-volatile storage elements that were supposed to remain erased comprising applying a boosting enabling voltage to a second set of control lines only for said subset of groups, applying a boosting disabling voltage to a third set of control lines for groups of non-volatile storage elements not in said subset, and charging a common substrate for said groups, whether in or not in said subset, to a non-negative voltage, and erasing one or more non-volatile storage elements in each group of said subset without intentionally erasing non-volatile storage elements in groups not in said subset by applying the non-negative voltage to said common first set of control lines.

20. The method according to claim 19, wherein:

said groups of non-volatile storage elements are NAND strings; and said common first set of control lines are word lines.

* * * * *